United States Patent
Lee

(10) Patent No.: US 10,162,544 B2
(45) Date of Patent: Dec. 25, 2018

(54) MEMORY SYSTEM AND OPERATING METHOD OF MEMORY SYSTEM FOR CONTROLLING MEMORY BLOCKS DIVIDED INTO MEMORY SUB-BLOCKS CONTAINING A PLURALITY OF MEMORY PAGES

(71) Applicant: SK hynix Inc., Gyeonggi-do (KR)

(72) Inventor: Jong-Min Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 291 days.

(21) Appl. No.: 15/096,580

(22) Filed: Apr. 12, 2016

(65) Prior Publication Data
US 2017/0139627 A1    May 18, 2017

(30) Foreign Application Priority Data
Nov. 13, 2015    (KR) .................. 10-2015-0159587

(51) Int. Cl.
*G06F 3/06* (2006.01)
*G06F 12/02* (2006.01)
(Continued)

(52) U.S. Cl.
CPC ............ *G06F 3/0626* (2013.01); *G06F 3/061* (2013.01); *G06F 3/064* (2013.01); *G06F 3/0616* (2013.01);
(Continued)

(58) Field of Classification Search
CPC ...... G06F 3/0626; G06F 3/061; G06F 3/0616; G06F 3/064; G06F 3/065; G06F 3/0659; G06F 3/0608; G06F 3/0673; G06F 3/0679; G06F 3/0685; G06F 12/0253; G06F 12/0246; G06F 12/0802; G06F 12/1009; G06F 12/1018; G06F 2212/1016; G06F 2212/60; G06F 2212/1056;
(Continued)

(56) References Cited

U.S. PATENT DOCUMENTS

| 2011/0055455 | A1* | 3/2011 | Post ................... G06F 12/0246 711/103 |
| 2012/0246415 | A1 | 9/2012 | Teo |

(Continued)

FOREIGN PATENT DOCUMENTS

| KR | 101204163 | 11/2012 |
| KR | 1020140094170 | 7/2014 |

*Primary Examiner* — Shane D Woolwine
(74) *Attorney, Agent, or Firm* — IP & T Group LLP

(57) ABSTRACT

A memory system may include a memory device comprising a plurality of memory blocks, each of the plurality of memory blocks comprising a plurality of pages having a plurality of memory cells coupled to a plurality of word lines, the memory device being suitable for storing read data and write data requested by a host in the plurality of pages, and a controller suitable for grouping the plurality of pages included in the memory blocks, dividing each of the memory blocks into a plurality of sub-memory blocks, programming data corresponding to a write command, performing an update program on the data programmed into the first memory block into the memory blocks in response to a write command, and storing a map list for the sub-memory blocks included in the first memory block in accordance with the update program.

20 Claims, 13 Drawing Sheets

(51) Int. Cl.
*G11C 16/04* (2006.01)
*G11C 16/10* (2006.01)
*G06F 12/1009* (2016.01)

(52) U.S. Cl.
CPC .......... *G06F 3/0659* (2013.01); *G06F 3/0665* (2013.01); *G06F 3/0673* (2013.01); *G06F 3/0679* (2013.01); *G06F 12/0253* (2013.01); *G06F 12/1009* (2013.01); *G11C 16/10* (2013.01); *G06F 2212/1056* (2013.01); *G06F 2212/651* (2013.01); *G06F 2212/657* (2013.01); *G11C 16/0483* (2013.01)

(58) Field of Classification Search
CPC ......... G06F 2212/651; G06F 2212/657; G06F 2212/7201; G06F 2212/7203; G06F 3/0665; G11C 16/10; G11C 16/0483
USPC .................................. 711/103, 154, 205–209
See application file for complete search history.

(56) References Cited

U.S. PATENT DOCUMENTS

| | | | |
|---|---|---|---|
| 2014/0281145 A1* | 9/2014 | Tomlin | G06F 12/0246 711/103 |
| 2016/0232088 A1* | 8/2016 | Mohan | G06F 12/0246 |

* cited by examiner

MEMORY SYSTEM AND OPERATING METHOD OF MEMORY SYSTEM FOR CONTROLLING MEMORY BLOCKS DIVIDED INTO MEMORY SUB-BLOCKS CONTAINING A PLURALITY OF MEMORY PAGES

CROSS-REFERENCE TO RELATED APPLICATION(S)

The present application claims priority of Korean Patent Application No. 10-2015-0159587, filed on Nov. 13, 2015, which is incorporated herein by reference in its entirety.

BACKGROUND

1. Field

Exemplary embodiments of the present invention relate generally to a memory system, and more particularly, to a memory system for processing data into a memory device and an operating method of the memory system.

2. Description of the Related Art

The computer environment paradigm has shifted to ubiquitous computing systems that can be used anywhere and at any time resulting in a rapidly increasing use of portable electronic devices such as mobile phones, digital cameras, and notebook computers has rapidly increased. These portable electronic devices generally use a memory system having a memory device for storing data, that is, a data storage device. A data storage device is used as a main memory device or an auxiliary memory device of a portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, solid state drives (SSD) and so forth.

SUMMARY

Various embodiments are directed to a memory system capable of minimizing a complexity of a memory device and a reduction of performance of the memory device, maximizing the use efficiency of the memory device, and processing data rapidly and stably and an operating method of the memory system.

In an embodiment, a memory system may include: a memory device comprising a plurality of memory blocks, each of the plurality of memory blocks comprising a plurality of pages having a plurality of memory cells coupled to a plurality of word lines, the memory device being suitable for storing read data and write data requested by a host in the plurality of pages, and a controller suitable for grouping the plurality of pages included in the memory blocks, dividing each of the memory blocks into a plurality of sub-memory blocks, programming data corresponding to a write command received from the host into a first memory block of the memory blocks, performing an update program on the data programmed into the first memory block into the memory blocks in response to a write command for the data programmed into the first memory block from the host, and storing a map list for the sub-memory blocks included in the first memory block in accordance with the update program.

The map list may include: a plurality of columns, each column corresponding to a respective memory block, and a plurality of bit regions included in the columns of the memory blocks, each bit region corresponding to the respective sub-memory block of the memory blocks.

The controller may store valid page count (VPC) information about a first sub-memory block of the first memory block in a bit region corresponding to the first sub-memory block and included in a first column of the map list corresponding to the first memory block in accordance with the update program.

The first memory block may be a closed memory block all pages of which have been subjected to a data program operation.

The controller may store: the map list in a memory of the controller, VPC information stored in bit regions of the map list corresponding to the closed memory block in the memory blocks, and map information about the closed memory block in the memory blocks.

The controller may identify valid pages included in the sub-memory blocks of the closed memory blocks by comparing the VPC information stored in the map list with the VPC information stored in the memory blocks with respect to the closed memory block.

If the VPC information is determined to be changed as a result of the comparison, the controller may search for and checks map information about a second sub-memory block which corresponds to a bit region storing the changed VPC information among the bit regions of the map list.

The controller may identify the valid pages included in the second sub-memory block through the search and check of the map information and updates the map information about the second sub-memory block.

If the VPC information is determined not to be changed as a result of the comparison, the controller may identify the valid pages included in the sub-memory blocks based on the VPC information.

The controller may generate an empty memory block, open memory block, or free memory block by performing garbage collection (GC) on the closed memory block whose valid page has been identified.

In an embodiment, an operating method of a memory system, may include: dividing each of a plurality of memory blocks into a plurality of sub-memory blocks, by grouping a plurality of pages included in each of the plurality of memory blocks of a memory device and having a plurality of memory cells coupled to a plurality of word lines, receiving a write command for a first memory block of the memory blocks from a host, programming data corresponding to the write command received from the host into the first memory block, receiving a write command for the data programmed into the first memory block from the host, and performing an update program on the data programmed into the first memory block into the memory blocks and storing a map list for the sub-memory blocks included in the first memory block in accordance with the update program.

The map list may include: a plurality of columns each corresponding to the respective memory blocks, and a plurality of bit regions included in the columns of the memory blocks each of which corresponds to the respective sub-memory blocks of the memory blocks.

The storing of the map list may include storing valid page count (VPC) information about a first sub-memory block of the first memory block in a bit region corresponding to the first sub-memory block and included in a first column of the map list corresponding to the first memory block in accordance with the update program.

The first memory block may include closed memory blocks comprising all pages on which a data program has been performed.

The storing of the map list may include: storing the map list in a memory of the controller, and storing in the memory blocks VPC information stored in bit regions included in the columns of the map list and corresponding to the closed memory blocks and map information about the closed memory blocks.

The operating method may further include identifying valid pages included in the sub-memory blocks of the closed memory blocks by comparing the VPC information stored in the map list with the VPC information stored in the memory blocks with respect to the closed memory blocks.

If the VPC information is determined to be changed as a result of the comparison, the identifying of the valid page may include searching for and checking map information about a second sub-memory block which corresponds to a bit region storing the changed VPC information among the bit regions of the map list.

The operating method may further include: identifying the valid pages included in the second sub-memory block through the search and check of the map information, and updating the map information about the second sub-memory block.

If the VPC information is determined to be not changed as a result of the comparison, the identifying of the valid pages may include identifying the valid pages included in the sub-memory blocks based on the VPC information.

The operating method may further include generating an empty memory block, an open memory block or a free memory block by performing garbage collection (GC) on the closed memory blocks whose valid page has been identified.

DETAILED DESCRIPTION

Figure 1:
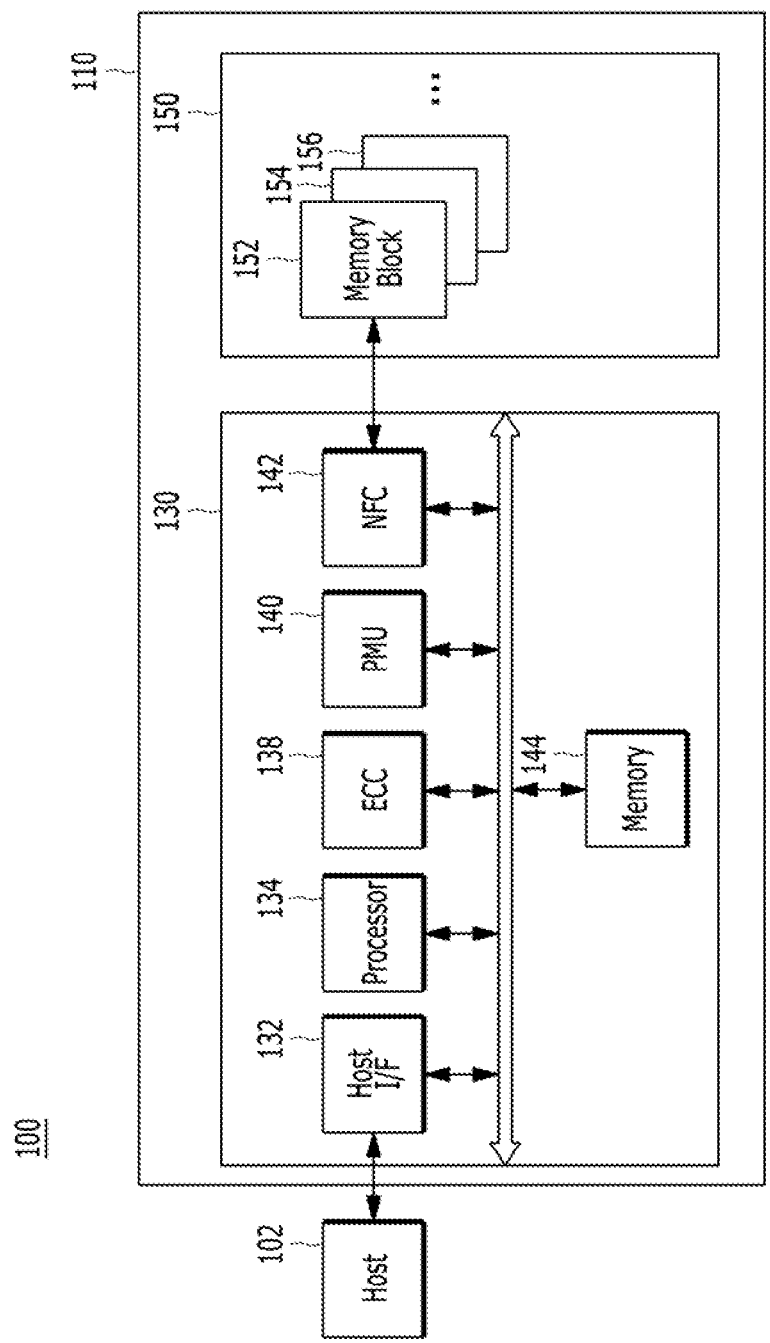
FIG. 1 is a diagram illustrating a data processing system including a memory system, according to an embodiment of the present invention.

Various embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete. Throughout the disclosure, like reference numerals refer to like parts throughout the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. When a first layer is referred to as being "on" a second layer or "on" a substrate, it not only refers to a case where the first layer is formed directly on the second layer or the substrate but also a case where a third layer exists between the first layer and the second layer or the substrate.

Referring now to FIG. 1, a data processing system 100, according to an embodiment of the present invention, may include a host 102 and a memory system 110.

The host 102 may include, for example, a portable electronic device such as a mobile phone, an MP3 player and a laptop computer, or a non-portable electronic device, such as a desktop computer, a game player, a TV, a projector and the like.

The memory system 110 may store data to be accessed by the host 102 in response to a request from the host 102. For example, the memory system 110 may be used as a main memory system or an auxiliary memory system of the host 102. The memory system 110 may be implemented to be electrically coupled with the host 102, according to a protocol of a host interface. The memory system 110 may be implemented with any one of various kinds of storage devices, such as a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card, a memory stick, and so forth.

The storage devices for the memory system 110 may be implemented with a volatile memory device such as a dynamic random access memory (DRAM), a static random access memory (SRAM) and the like. Alternatively, the storage devices for the memory system 110 may be implemented with a nonvolatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), a resistive RAM (RRAM) and the like.

The memory system 110 may include a memory device 150 for storing data and a controller 130 for controlling the storage of data in the memory device 150. The stored data in the memory device 150 may be accessed by the host 102.

The controller 130 and the memory device 150 may be integrated into a semiconductor device. For instance, the controller 130 and the memory device 150 may be integrated into a semiconductor device configured as a solid state drive (SSD). When the memory system 110 is used as a SSD, the operation speed of the host 102 that is electrically coupled with the memory system 110 may be substantially increased.

The controller 130 and the memory device 150 may be integrated into a semiconductor device configured as a memory card such as a Personal Computer Memory Card International Association (PCMCIA) card, a compact flash (CF) card, a smart media (SM) card (SMC), a memory stick, a multimedia card (MMC), an RS-MMC and a micro-MMC, a secure digital (SD) card, a mini-SD, a micro-SD and an SDHC, a universal flash storage (UFS) device and like.

For another instance, the memory system 110 may configure a computer, an ultra-mobile PC (UMPC), a workstation, a net-book, a personal digital assistant (PDA), a portable computer, a web tablet, a tablet computer, a wireless phone, a mobile phone, a smart phone, an e-book a portable multimedia player (PMP), a portable game player, a navigation device, a black box a digital camera, a digital multimedia broadcasting (DMB) player, a three-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, an RFID device, one of various component elements configuring a computing system and the like.

The memory device 150 may be a nonvolatile memory device, such as, for example, a flash memory capable of retaining stored data even when a power supply is interrupted or turned off. During a write operation, the memory device 150 may store data provided from the host 102. During a read operation, the memory device 150 may provide stored data to the host 102. One or more memory devices 150, may be employed. The one or more memory devices 150 may be substantially identical. The one or more memory devices may be a combination of different type of memory devices.

The memory device 150 may include a plurality of memory blocks, for example, memory blocks 152, 154 and 156. Each of the memory blocks 152, 154 and 156 may include a plurality of pages. Each of the pages may include a plurality of memory cells electrically coupled to a plurality of word lines (WL). The memory device 150 may have a three-dimensional (3D) stack structure wherein the various components of the memory device are arranged in multiple layers. In an embodiment, the memory device 150 may be a flash memory having a 3D stack structure. An example of a memory device 150 including a 3D stack structure will be described later in detail with reference to FIGS. 2 to 11.

The controller 130 may control the overall operations of the memory device 150, such as, for example, a read, write, program and or erase operations. Generally, the controller 130 may control the memory device 150 in response to a request from the host 102. For example, the controller 130 may provide data read from the memory device 150 to the host 102, in response to a read request from the host 102. Or, also as an example, the controller may store data provided from the host 102 into the memory device 150 in response to a write request.

In an embodiment, the controller 130 may include a host interface unit 132, a processor 134, an error correction code (ECC) unit 138, a power management unit (PMU) 140, a NAND flash controller (NFC) 142, and a memory 144.

The host interface unit 132 may process commands and data provided from the host 102. The host interface unit 132 may communicate with the host 102 through at least one of various interface protocols, such as a universal serial bus (USB), a multimedia card (MMC), peripheral component interconnect-express (PCI-E), a serial attached SCSI (SAS) a serial advanced technology attachment (ATA) a parallel advanced technology attachment (PATA), a small computer system interface (SCSI), an enhanced small disk interface (ESDI), an integrated drive electronics (IDE) and the like. The host interface unit 132 may include any suitable circuits, systems or devices suitable for communicating with the host 102 and the other components of the controller 100 as may be needed.

The ECC unit 138 may detect and correct errors of the data read from the memory device 150 during a read operation. In an embodiment, if the number of error bits detected by the ECC unit 138 is greater than or equal to a threshold number of correctable error bits, the ECC unit 138 may not correct the error bits and output an error correction fail signal indicating failure in correcting the error bits.

The ECC unit 138 may perform an error correction operation based on any suitable error correction scheme. For example, the ECC unit 138 may perform an error correction operation based on a coded modulation scheme such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and the like. The ECC unit 138 may include any suitable circuits, systems or devices for the error correction operation.

The PMU 140 may provide and manage electric power for the controller 130. The PMU 140 may provide and manage electric power, for example, power for the various components of the controller 130 as may be needed. The PMU 140 may provide different voltage power to the various components of the controller as may be needed. The PMU 140 may provide same voltage power to the various components of the controller.

The NFC 142 may serve as a memory interface between the controller 130 and the memory device 150 to allow the controller 130 to control the memory device 150 in response to a request from the host 102. For example, the NFC 142 may generate control signals for the memory device 150 and process data under the control of the processor 134 when the memory device 150 is a flash memory especially a NAND flash memory.

The memory 144 may serve as a working memory of the memory system 110 and the controller 130, and store data for driving the memory system 110 and the controller 130. For example, when the controller 130 controls the operations of the memory device 150, the memory 144 may store data used by the controller 130 and the memory device 150 for such operations as read, write, program and erase operations.

The memory 144 may be or comprise a volatile memory. For example, the memory 144 may be or comprise a static random access memory (SRAM) or a dynamic random access memory (DRAM). As described above, the memory 144 may store data used by the host 102 and the memory device 150 for read and/or write operations. The memory 144 may be or comprise a program memory, a data memory, a write buffer, a read buffer, a map buffer, and the like.

The processor 134 may control the general operations of the memory system 110. The processor 134 may control a write or a read operation for the memory device 150, in response to a write or a read request from the host 102. The processor 134 may drive a firmware, also referred to as a flash translation layer (FTL), for controlling the general operations of the memory system 110. The processor 134 may be implemented with a microprocessor, a central processing unit (CPU) and the like.

A management unit (not shown) may be included in the processor 134 for performing a bad block management of the memory device 150. For example, the management unit may find bad memory blocks included in the memory device 150, i.e., memory blocks which are in an unsatisfactory condition for further use, and perform a bad block management on the bad memory blocks. When a flash memory, for example, a NAND flash memory is employed as the memory device 150, a program failure may occur during the write operation, for example, during the program operation, due to inherent characteristics of a NAND logic function. During a bad block management, the data of the program-failed memory blocks or the bad memory blocks may be programmed into a new memory block. Also, the bad blocks due to the program fail may seriously deteriorate the utilization efficiency of the memory device 150 having a 3D stack structure and the reliability of the memory system 100, and thus reliable bad block management is required.

Figure 2:
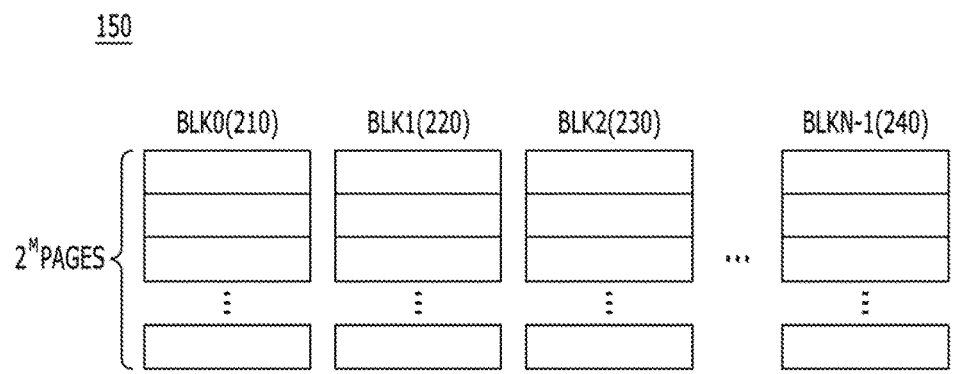
FIG. 2 is a diagram illustrating a memory device including a plurality of emery blocks, according to an embodiment of the present invention.

Referring to FIG. 2, the memory device 150 may include a plurality of memory blocks, for example, zeroth to $(N-1)^{th}$ blocks 210 to 240, where N is a positive integer. Each of the plurality of memory blocks 210 to 240 may include a plurality of pages, for example, $2^M$ number of pages ($2^M$ PAGES), where M is a positive integer. Each of the plurality of pages may include a plurality of memory cells to which a plurality of word lines may be electrically coupled. It is noted that any number of suitable blocks and pages per block may be employed.

The memory blocks may be single level cell (SLC) memory blocks and/or multi-level cell (MLC) memory blocks, according to the number of bits which may be stored or expressed in each memory cell. An SLC memory block may include a plurality of pages which are implemented with memory cells each capable of storing 1-bit data. An MLC memory block may include a plurality of pages which are implemented with memory cells each capable of storing multi-bit data, for example, two or more-bit data. An MLC memory block including a plurality of pages which are implemented with memory cells each capable of storing 3-bit data may also be referred to as a triple level cell (TLC) memory block.

Each of the plurality of memory blocks 210 to 240 may store data provided from the host device 102 during a write operation and may provide stored data to the host 102 during a read operation.

Figure 3:
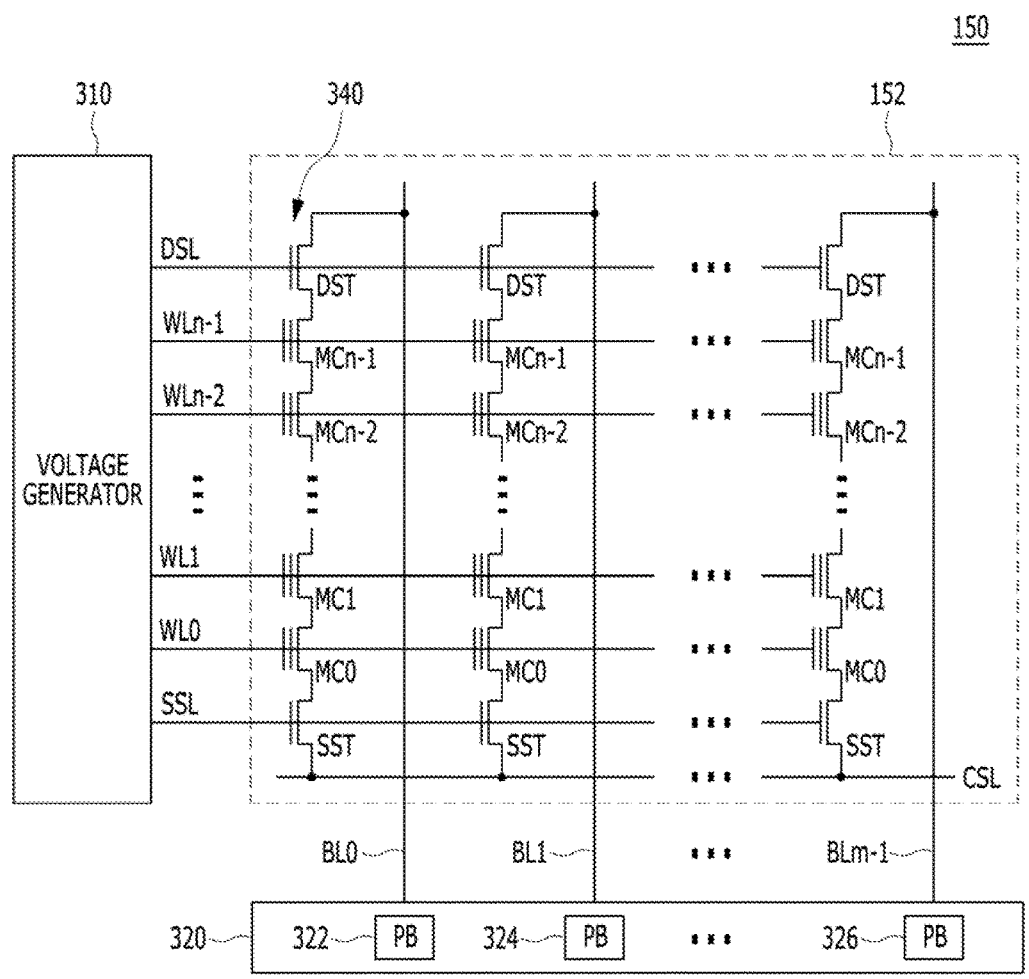
FIG. 3 is a circuit diagram illustrating a memory block of a memory device, according to an embodiment of the present invention.

FIG. 3 is a circuit diagram illustrating one of the plurality of memory blocks 152 to 156, according to an embodiment of the present invention.

Referring to FIG. 3, the memory block 152 of the memory device 150 may include a plurality of cell strings 340 electrically coupled to bit lines BL0 to BLm−1, respectively. Each cell string 340 may include at least one drain select transistor DST and at least one source select transistor SST. A plurality of memory cells or a plurality of memory cell transistors MC0 to MCn−1 may be electrically coupled in series between the select transistors DST and SST. The respective memory cells MC0 to MCn−1 may be consist of multi-level cells (MLC), each of which stores data information of a plurality of bits. The memory cells may have any suitable architecture.

In FIG. 3, 'DSL' denotes a drain select line, 'SSL' denotes a source select line, and 'CSL' denotes a common source line.

FIG. 3 shows, as an example, a memory block 152 configured by NAND flash memory cells. It is noted, however, that the memory block 152 of the memory device 150 according to the embodiment is not limited to NAND flash memory and may be realized by NOR flash memory, hybrid flash memory having at least two kinds of memory cells are combined, or one-NAND flash memory having a controller is built in a memory chip. The operational characteristics of a semiconductor device may be applied to not only a flash memory device in which a charge storing layer is configured by conductive floating gates but also a charge trap flash (CTF) in which a charge storing layer is configured by a dielectric layer.

It is also noted that the memory device 150 is not limited to a flash memory device only. For example, the memory device 150 may be a DRAM or a SRAM device.

A voltage generator 310 of the memory device 150 may generate word line voltages, for example, a program voltage, a read voltage and a pass voltage, to supply to respective word lines according to an operation mode. Further, the voltage generator 310 may generate voltages to be supplied to bulks, for example, well regions in which the memory cells are formed. The voltage generator 310 may perform a voltage generating operation under a control of a control circuit (not shown). The voltage generator 310 may generate a plurality of variable read voltages to generate a plurality of read data. The voltage generator 310 may select one of the memory blocks or sectors of a memory cell array, select one of the word lines of the selected memory block, and provide the word line voltages to the selected word line and unselected word lines, under the control of the control circuit.

A read/write circuit 320 of the memory device 150 may be controlled by the control circuit, and may serve as a sense amplifier or a write driver according to an operation mode. During verification/normal read operation the read/write circuit 320 may serve as a sense amplifier for reading data from the memory cell array. Also, during a program operation, the read/write circuit 320 may serve as a write driver for driving bit lines according to data to be stored in the memory cell array. The read/write circuit 320 may receive data to be written in the memory cell array, from a buffer (not shown), during the program operation, and may drive the bit lines according to the inputted data. To this end, the read/write circuit 320 may include a plurality of page buffers 322, 324 and 326 respectively corresponding to the columns (or bit lines) or pairs of the columns (or pairs of bit lines). Each of the page buffers 322, 324 and 326 may include a plurality of latches (not shown).

Figure 4:
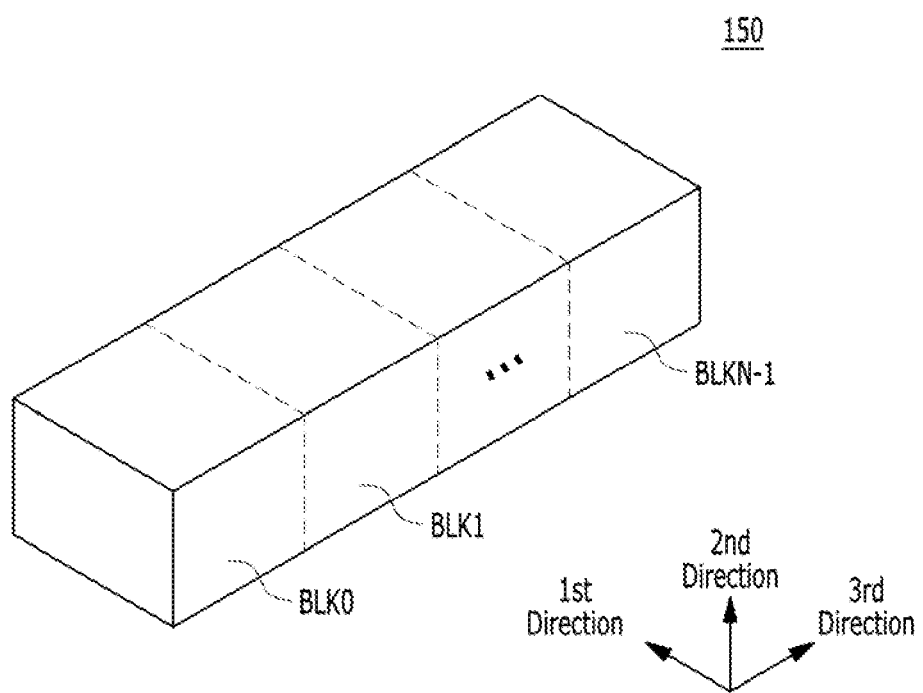
FIGS. 4 to 11 are diagrams schematically illustrating a memory device, according to various embodiments of the present invention.

FIG. 4 is a block diagram illustrating an example of the plurality of memory blocks 152 to 156 of the memory device 150 according to an embodiment of the present invention.

Referring to FIG. 4, the memory device 150 may include a plurality of memory blocks BLK0 to BLKN−1. Each of the memory blocks BLK0 to BLKN−1 may be realized in a 3D structure or a vertical structure. The respective memory blocks BLK0 to BLKN−1 may include a plurality of structures extending in first to third directions, for example, an x-axis direction, a y-axis direction and a z-axis direction.

The respective memory blocks BLK0 to BLKN−1 may include a plurality of NAND strings NS extending in the second direction. The plurality of NAND strings NS may be provided in the first direction and the third direction. Each NAND string NS may be electrically coupled to a bit line BL, at least one source select line SSL, at least one ground select line GSL, a plurality of word lines WL, at least one dummy word line DWL, and a common source line CSL. For example, the respective memory blocks BLK0 to BLKN−1 may be electrically coupled to a plurality of bit lines BL, a plurality of source select lines SSL, a plurality of ground select lines GSL, a plurality of word lines WL, a plurality of dummy word lines DWL, and a plurality of common source lines CSL.

Figure 5:
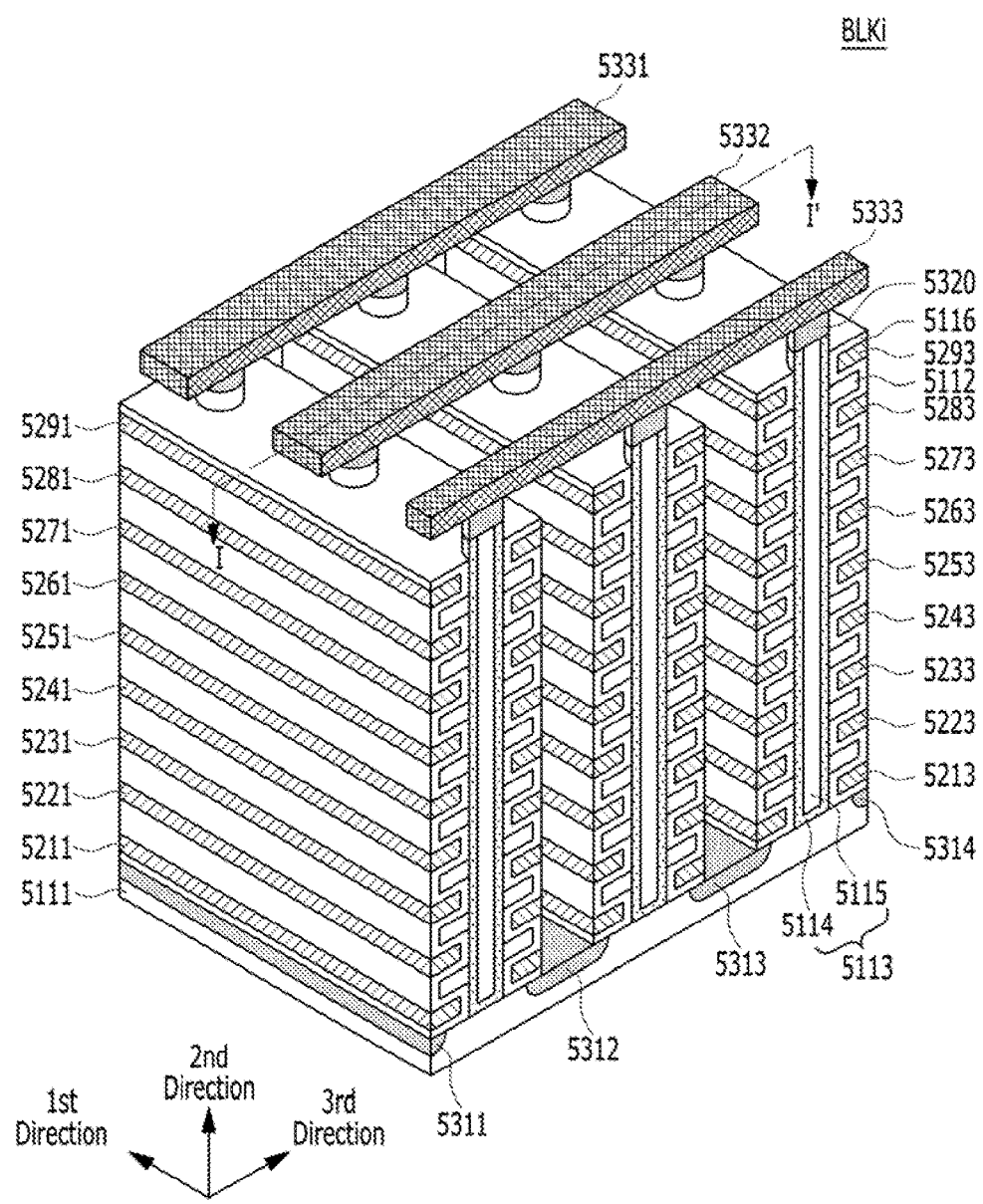
Figure 6:
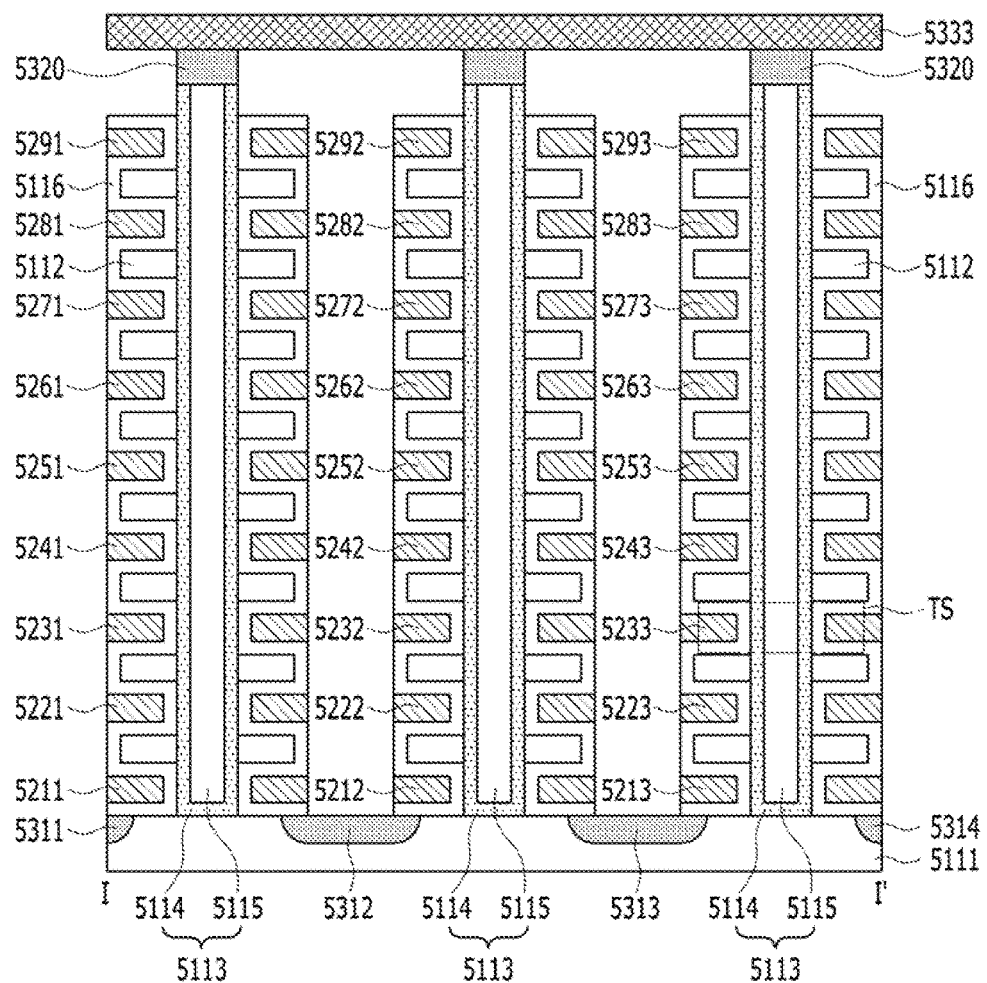

FIG. 5 is a perspective view of one BLKi of the plurality of memory blocks BLK0 to BLKN−1 shown in FIG. 4. FIG. 6 is a cross-sectional view taken along a line I-I' of the memory block BLKi shown in FIG. 5.

Referring to FIGS. 5 and 6, a memory block BLKi among the plurality of memory blocks of the memory device 150 may include a structure extending in the first to third directions.

A substrate 5111 may be provided. The substrate 5111 may include a silicon material doped with a first type impurity. The substrate 5111 may include a silicon material doped with a p-type impurity. The substrate 5111 may be a p-type well, for example, a pocket p-well. The substrate 5111 may further include an n-type well surrounding the p-type well. Although, in the embodiment of the present invention, the substrate 5111 is exemplified as being the p-type silicon, it is noted that the substrate 5111 is not limited to the p-type silicon.

A plurality of doping regions 5311 to 5314 extending in the first direction may be provided over the substrate 5111. The plurality of doping regions 5311 to 5314 may contain a second type impurity that is different from that of the substrate 5111. The plurality of doping regions 5311 to 5314 may be doped with an n-type impurity. Although, in the embodiment of the present invention, first to fourth doping regions 5311 to 5314 are exemplified as being the n-type, it is noted that they are not limited to the n-type.

In the region over the substrate 5111 between the first and second doping regions 5311 and 5312, a plurality of dielectric materials 5112 extending in the first direction may be sequentially provided in the second direction. The dielectric materials 5112 may be separated from the substrate 5111 by a preset distance in the second direction. Each of dielectric materials 5112 may be separated from one another by a preset distance in the second direction. The dielectric materials 5112 may include a dielectric material such as silicon oxide.

In the region over the substrate 5111 between the first and second doping regions 5311 and 5312, a plurality of pillars 5113 which are sequentially disposed in the first direction and pass through the dielectric materials 5112 in the second direction may be provided. The plurality of pillars 5113 may respectively pass through the dielectric materials 5112 and may be electrically coupled with the substrate 5111. Each pillar 5113 may be configured by a plurality of materials. A surface layer 5114 of each pillar 5113 may include a silicon material doped with the first type of impurity. The surface layer 5114 of each pillar 5113 may include a silicon material doped with the same type of impurity as the substrate 5111. Although, in the embodiment of the present invention, the surface layer 5114 of each pillar 5113 is exemplified as including p-type silicon the surface layer 5114 of each pillar 5113 is not limited to the p-type silicon.

An inner layer 5115 of each pillar 5113 may be formed of a dielectric material. The inner layer 5115 of each pillar 5113 may be filled by a dielectric material such as silicon oxide.

In the region between the first and second doping regions 5311 and 5312, a dielectric layer 5116 may be provided along exposed surfaces of the dielectric materials 5112, the pillars 5113 and the substrate 5111. A thickness of the dielectric layer 5116 may be less than one half of the distance between the dielectric materials 5112. In other words, a region of a material other than the dielectric material 5112 and the dielectric layer 5116 may be provided between (i) the dielectric layer 5116 provided below the bottom surface of a first dielectric material of the dielectric materials 5112 and (ii) the dielectric layer 5116 provided over the top surface of a second dielectric material of the dielectric materials 5112. The dielectric materials 5112 may lie below the first dielectric material.

In the region between the first and second doping regions 5311 and 5312, conductive materials 5211 to 5291 may be provided over an exposed surface of the dielectric layer 5116. The conductive material 5211 extending in the first direction may be provided between the dielectric material 5112 adjacent to the substrate 5111 and the substrate 5111. In particular, the conductive material 5211 extending in the first direction may be provided between (i) the dielectric layer 5116 disposed over the substrate 5111 and (ii) the dielectric layer 5116 disposed below the bottom surface of the dielectric material 5112 adjacent to the substrate 5111.

The conductive material extending in the first direction may be provided between (i) the dielectric layer 5116 disposed over the top surface of one of the dielectric materials 5112 and (ii) the dielectric layer 5116 disposed below the bottom surface of another dielectric material of the dielectric materials 5112, which is disposed over the one dielectric material 5112. The conductive materials 5221 to 5281 extending in the first direction may be provided between the dielectric materials 5112. The top conductive material 5291 extending in the first direction may be provided over the uppermost dielectric material 5112. The conductive materials 5211 to 5291 extending in the first direction may be made of a metallic material. The conductive materials 5211 to 5291 extending in the first direction may be made of a conductive material such as polysilicon.

In the region between the second doping region 5312 and a third doping region 5313, the same structures as the structures between the first and second doping regions 5311 and 5312 may be provided. For example, in the region between the second and third doping regions 5312 and 5313 the plurality of dielectric materials 5112 extending in the first direction, the plurality of pillars 5113 which are sequentially arranged in the first direction and pass through the plurality of dielectric materials 5112 in the second direction, the dielectric layer 5116 which is provided over the exposed surfaces of the plurality of dielectric materials 5112 and the plurality of pillars 5113, and the plurality of conductive materials 5212 to 5292 extending in the first direction may be provided.

In the region between the third doping region 5313 and a fourth doping region 5314, the same structures as between the first and second doping regions 5311 and 5312 may be provided. For example, in the region between the third and fourth doping regions 5313 and 5314, the plurality of dielectric materials 5112 extending in the first direction, the plurality of pillars 5113 which are sequentially arranged in the first direction and pass through the plurality of dielectric materials 5112 in the second direction, the dielectric layer 5116 which is provided over the exposed surfaces of the plurality of dielectric materials 5112 and the plurality of pillars 5113, and the plurality of conductive materials 5213 to 5293 extending in the first direction may be provided.

Drains 5320 may be respectively provided over the plurality of pillars 5113. The drains 5320 may be made of silicon materials doped with second type impurities. The drains 5320 may be made of silicon materials doped with n-type impurities. Although, for the sake of convenience of explanation, the drains 5320 are exemplified as including n-type silicon, it is noted that the drains 5320 are not limited to the n-type silicon. For example, the width of each drain 5320 may be larger than the width of each corresponding pillar 5113. Each drain 5320 may be provided in the shape of a pad over the top surface of each corresponding pillar 5113.

Conductive materials 5331 to 5333 extending in the third direction may be provided over the drains 5320. Each of the conductive materials 5331 to 5333 may be extendedly disposed over the drains 5320 serially arranged in the third direction with a preset separation distance to each other in the first direction. The respective conductive materials 5331 to 5333 may be electrically coupled with the drains 5320 there below. The drains 5320 and the conductive materials 5331 to 5333 extending in the third direction may be electrically coupled with through contact plugs. The conductive materials 5331 to 5333 extending in the third direction may be made of a metallic material. The conductive materials 5331 to 5333 extending in the third direction may be made of a conductive material such as polysilicon.

In FIGS. 5 and 6, the respective pillars 5113 may form strings together with the dielectric layer 5116 and the conductive materials 5211 to 5291, 5212 to 5292 and 5213 to 5293 extending in the first direction. The respective pillars 5113 may form NAND strings NS together with the dielectric layer 5116 and the conductive materials 5211 to 5291, 5212 to 5292 and 5213 to 5293 extending in the first direction. Each NAND string NS may include a plurality of transistor structures TS.

Figure 7:
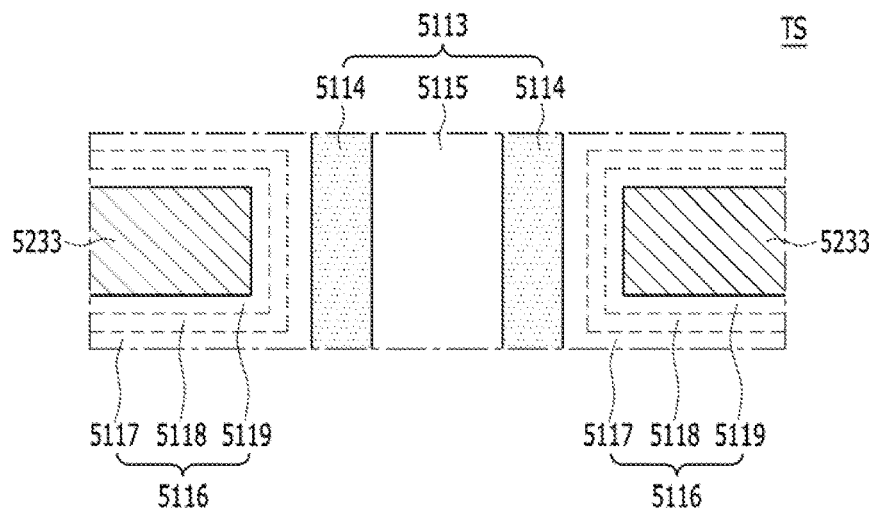

Referring now to FIG. 7 in the transistor structure TS shown in FIG. 6, the dielectric layer 5116 may include first to third sub-dielectric layers 5117, 5118 and 5119.

The surface layer 5114 of p-type silicon in each of the pillars 5113 may serve as a body. The first sub dielectric layer 5117 adjacent to the pillar 5113 may serve as a tunneling dielectric layer, and may include a thermal oxidation layer.

The second sub dielectric layer 5118 may serve as a charge storing layer. The second sub dielectric layer 5118 may serve as a charge capturing layer, and may include a nitride layer or a metal oxide layer such as an aluminum oxide layer a hafnium oxide layer, or the like.

The third sub dielectric layer 5119 adjacent to the conductive material 5233 may serve as a blocking dielectric layer. The third sub dielectric layer 5119 adjacent to the conductive material 5233 extending in the first direction may be formed as a single layer or multiple layers. The third sub dielectric layer 5119 may be a high-k dielectric layer such as an aluminum oxide layer, a hafnium oxide layer, or the like, which has a dielectric constant greater than the first and second sub dielectric layers 5117 and 5118.

The conductive material 5233 may serve as a gate or a control gate. For example, the gate or the control gate 5233, the blocking dielectric layer 5119, the charge storing layer 5118, the tunneling dielectric layer 5117 and the body 5114 may form a transistor or a memory cell transistor structure. For example, the first to third sub dielectric layers 5117 to 5119 may form an oxide-nitride-oxide (ONO) structure. In the embodiment, for the sake of convenience of explanation, the surface layer 5114 of p-type silicon in each of the pillars 5113 will be referred to as a body in the second direction.

The memory block BLKi may include the plurality of pillars 5113. For example, the memory block BLKi may include the plurality of NAND strings NS. In detail, the memory block BLKi may include the plurality of NAND strings NS extending in the second direction or a direction perpendicular to the substrate 5111.

Each NAND string NS may include the plurality of transistor structures TS which are disposed in the second direction. At least one of the plurality of transistor structures TS of each NAND string NS may serve as a string source transistor SST. At least one of the plurality of transistor structures TS of each NAND string NS may serve as a ground select transistor GST.

The gates or control gates may correspond to the conductive materials 5211 to 5291, 5212 to 5292 and 5213 to 5293 extending in the first direction. For example, the gates or the control gates may extend in the first direction and form word lines and at least two select lines including at least one source select line SSL and at least one ground select line GSL.

The conductive materials 5331 to 5333 extending in the third direction may be electrically coupled to one ends of the NAND strings NS. The conductive materials 5331 to 5333 extending in the third direction may serve as bit lines BL. For example, in one memory block BLKi, the plurality of NAND strings NS may be electrically coupled to one bit line BL.

The second type doping regions 5311 to 5314 extending in the first direction may be provided to the other ends of the NAND strings NS. The second type doping regions 5311 to 5314 extending in the first direction may serve as common source lines CSL.

For example, the memory block BLKi may include a plurality of NAND strings NS extending in a direction perpendicular to the substrate 5111, e.g., the second direction, and may serve as a NAND flash memory block, for example, of a charge capturing type memory, in which the plurality of NAND strings NS are electrically coupled to one-bit line BL.

Although it is illustrated in FIGS. 5 to 7 that the conductive materials 5211 to 5291, 5212 to 5292 and 5213 to 5293 extending in the first direction are provided by nine (9) layers, it is noted that the conductive materials 5211 to 5291, 5212 to 5292 and 5213 to 5293 extending in the first direction are not limited thereto. For example, conductive materials extending in the first direction may be provided in eight (8) layers, sixteen (16) layers or any multiple layers. For example, in one NAND string NS, the number of transistors may be 8, 16 or more.

Although it is illustrated in FIGS. 5 to 7 that three (3) NAND strings NS are electrically coupled to one-bit line BL, it is noted that the embodiment is not limited thereto. In the memory block BLKi, m NAND strings NS may be electrically coupled to one-bit line BL, m being a positive integer. The number of conductive materials 5211 to 5291, 5212 to 5292 and 5213 to 5293 extending in the first direction and the number of common source lines 5311 to 5314 may vary with the number of NAND strings NS which are electrically coupled to one-bit line BL.

Further, although it is illustrated in FIGS. 5 to 7 that three (3) NAND strings NS are electrically coupled to one conductive material extending in the first direction, it is noted that the embodiment is not limited thereto. For example, n NAND strings NS may be electrically coupled to one conductive material extending in the first direction, n being a positive integer. The number of bit lines 5331 to 5333 may be vary with the number of NAND strings NS which are electrically coupled to one conductive material extending in the first direction.

Figure 8:
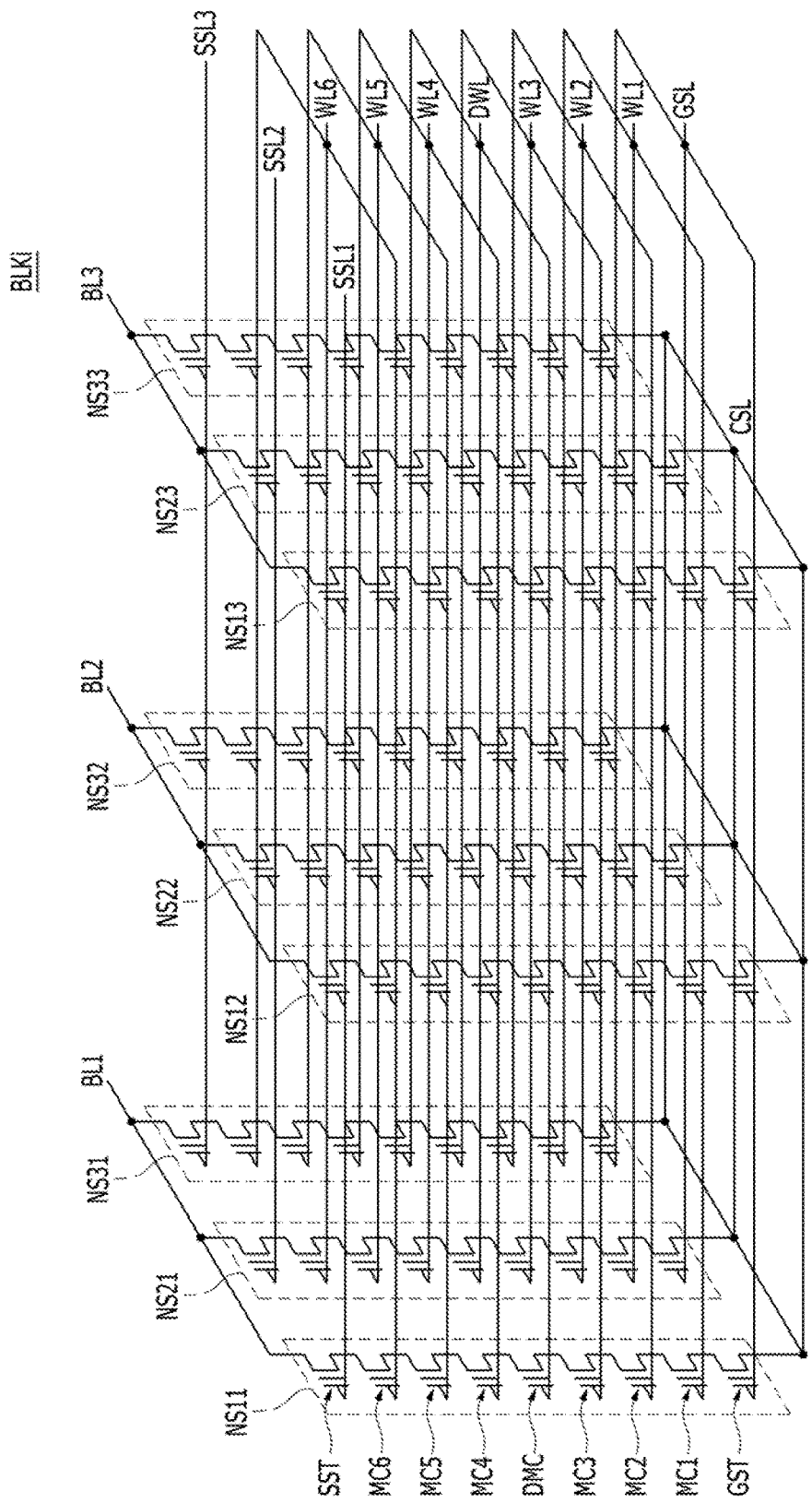

Referring to FIG. 8, in a block BLKi having the first structure, NAND strings NS11 to NS31 may be provided between a first bit line BL1 and a common source line CSL. The first bit line BL1 may correspond to the conductive material 5331 of FIGS. 5 and 6, extending in the third direction. NAND strings NS12 to NS32 may be provided between a second bit line BL2 and the common source line CSL. The second bit line BL2 may correspond to the conductive material 5332 of FIGS. 5 and 6, extending in the third direction. NAND strings NS13 to NS33 may be provided between a third bit line BL3 and the common source line CSL. The third bit line BL3 may correspond to the conductive material 5333 of FIGS. 5 and 6 extending in the third direction.

A source select transistor SST of each NAND string NS may be electrically coupled to a corresponding bit line BL. A ground select transistor GST of each NAND string NS may be electrically coupled to the common source line CSL. Memory cells MC1 to MC6 may be provided between the source select transistor SST and the ground select transistor GST of each NAND string NS.

In this example, the NAND strings NS may be defined by units of rows and columns. The NAND strings NS which are electrically coupled to one-bit line may form one column. The NAND strings NS11 to NS31 which are electrically coupled to the first bit line BL1 may correspond to a first column. The NAND strings NS12 to NS32 which are electrically coupled to the second bit line BL2 may correspond to a second column. The NAND strings NS13 to NS33 which are electrically coupled to the third bit line BL3 may correspond to a third column. The NAND strings NS which are electrically coupled to one source select line SSL may form one row. The NAND strings NS11 to NS13 which are electrically coupled to a first source select line SSL1 may form a first row. The NAND strings NS21 to NS23 which are electrically coupled to a second source select line SSL2 may form a second row. The NAND strings NS31 to NS33 which are electrically coupled to a third source select line SSL3 may form a third row.

In each NAND string NS, a height may be defined. In each NAND string NS, the height of the memory cell MC1 adjacent to the ground select transistor GST may have, for example, a value '1'. In each NAND string NS, the height of a memory cell may increase as the memory cell gets closer to the source select transistor SST when measured from the substrate 5111. In each NAND string NS, the height of a memory cell MC6 adjacent to the source select transistor SST may have, for example, a value '7'.

The source select transistors SST of the NAND strings NS arranged in the same row may share the source select line SSL. The source select transistors SST of the NAND strings NS arranged in different rows may be respectively electrically coupled to the different source select lines SSL1, SSL2 and SSL3.

The memory cells at the same height in the NAND strings NS in the same row may share a word line WL. For example, at the same height, the word lines WL electrically coupled to the memory cells MC of the NAND strings NS in different rows may be electrically coupled with each other. Dummy memory cells DMC at the same height in the NAND strings NS of the same row may share a dummy word line DWL. For example, at the same height or level, the dummy word lines DWL electrically coupled to the dummy memory cells DMC of the NAND strings NS in different rows may be electrically coupled with each other.

The word lines WL or the dummy word lines DWL located at the same level or height or layer may be electrically coupled with each other for each of layers where the conductive materials 5211 to 5291, 5212 to 5292 and 5213 to 5293 extending in the first direction may be provided. The conductive materials 5211 to 5291, 5212 to 5292 and 5213 to 5293 extending in the first direction may be electrically coupled in common to upper layers through contacts. In other words, the ground select transistors GST of the NAND strings NS in the same row may share the ground select line GSL. Further, the ground select transistors GST of the NAND strings NS in different rows may share the ground select line GSL. For example, the NAND strings NS11 to NS13, NS21 to NS23 and NS31 to NS33 may be electrically coupled in common to the ground select line GSL.

The common source line CSL may be electrically coupled in common to the NAND strings NS. Over the active regions over the substrate 5111, the first to fourth doping regions 5311 to 5314 may be electrically coupled. The first to fourth doping regions 5311 to 5314 may be electrically coupled in common to an upper layer through contacts.

For example, as shown in FIG. 8, the word lines WL of the same height or level may be electrically coupled to each other. Accordingly, when a word line WL at a certain height is selected, all NAND strings NS which are electrically coupled to the selected word line WL may be selected. The NAND strings NS in different rows may be electrically coupled to different source select lines SSL. Accordingly, among the NAND strings NS electrically coupled to the same word line WL by selecting one of the source select lines SSL1 to SSL3, the NAND strings NS in the unselected rows may be electrically isolated from the bit lines BL1 to BL3. In other words, by selecting one of the source select lines SSL1 to SSL3, the NAND strings NS arranged in the same row as the selected source line may be selected. Furthermore, by selecting one of the bit lines BL1 to BL3, the NAND strings NS arranged in the same column as the selected bit line may be selected. Accordingly, only the NAND strings NS arranged in the same row as the selected source line and the same column as the selected bit line may be selected.

In each NAND string NS, a dummy memory cell DMC may be provided. In FIG. 8, for example, the dummy memory cell DMC may be provided between a third memory cell MC3 and a fourth memory cell MC4 in each NAND string NS. For example, first to third memory cells MC1 to MC3 may be provided between the dummy memory cell DMC and the ground select transistor GST. Fourth to sixth memory cells MC4 to MC6 may be provided between the dummy memory cell DMC and the source select transistor SST. The memory cells MC of each NAND string NS may be divided into two (2) memory cell groups by the dummy memory cell DMC. In the divided memory cell groups, memory cells, for example, MC1 to MC3, adjacent to the ground select transistor GST may be referred to as a lower memory cell group, and remaining memory cells, for example, MC4 to MC6, adjacent to the string select transistor SST may be referred to as an upper memory cell group.

Herein below, detailed descriptions will be made with reference to FIGS. 9 to 11 which show a memory device in a memory system according to an embodiment implemented with a three-dimensional (3D) nonvolatile memory device different from the first structure.

Figure 9:
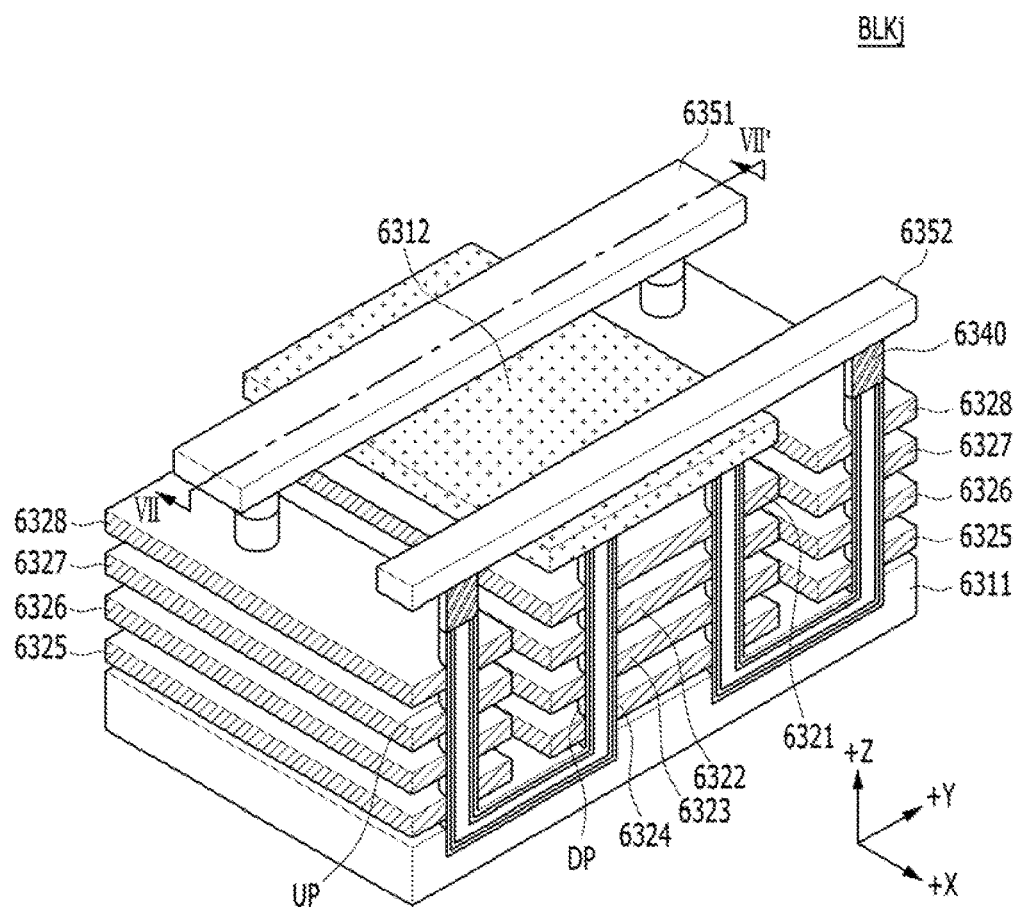

FIG. 9 is a perspective view schematically illustrating the memory device implemented with the three-dimensional (3D) nonvolatile memory device, which is different from the first structure described above with reference to FIGS. 5 to 8 and showing a memory block BLKj of the plurality of memory blocks of FIG. 4. FIG. 10 is a cross-sectional view illustrating the memory block BLKj taken along the line VII-VII' of FIG. 9.

Figure 10:
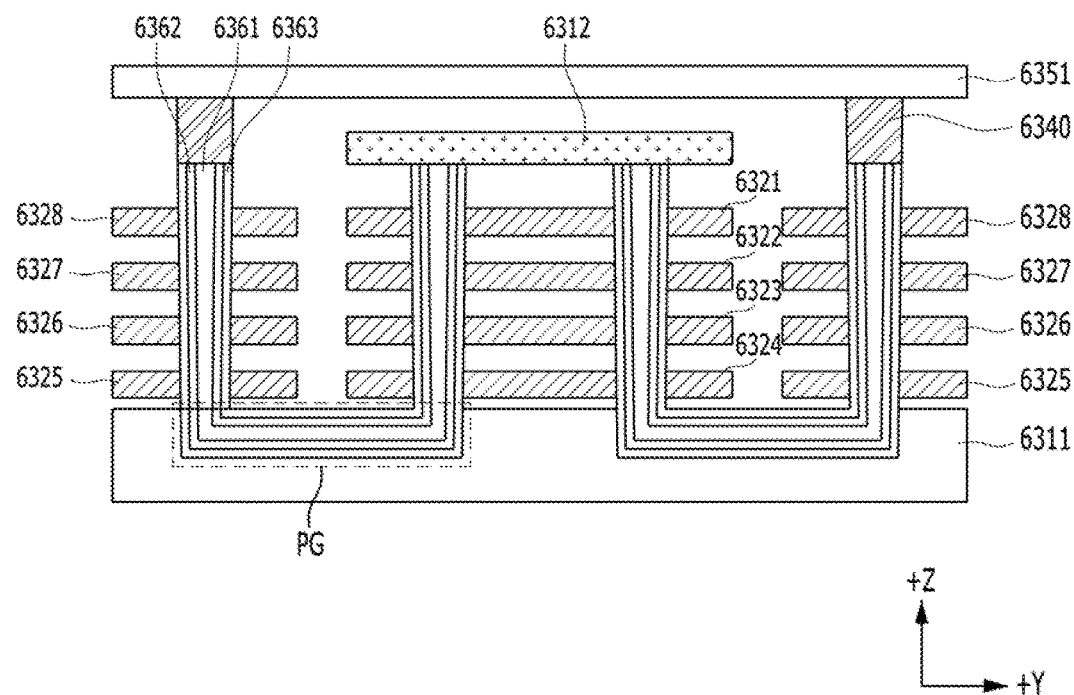

Referring to FIGS. 9 and 10, the memory block BLKj among the plurality of memory blocks of the memory device 150 of FIG. 1 may include structures extending in the first to third directions.

A substrate 6311 may be provided. For example, the substrate 6311 may include a silicon material doped with a first type impurity. For example, the substrate 6311 may include a silicon material doped with a p-type impurity. The substrate 6311 may be a p-type well, for example, a pocket p-well. The substrate 6311 may further include an n-type well which surrounds the p-type well. Although, in the described embodiment, the substrate 6311 is exemplified as being the p-type silicon, it is noted that the substrate 6311 is not limited to the p-type silicon.

First to fourth conductive materials 6321 to 6324 extending in an x-axis direction and a y-axis direction are provided over the substrate 6311. The first to fourth conductive materials 6321 to 6324 may be separated by a preset distance in the z-axis direction.

Fifth to eighth conductive materials 6325 to 6328 extending in the x-axis direction and the y-axis direction may be provided over the substrate 6311. The fifth to eighth conductive materials 6325 to 6328 may be separated by the preset distance in the z-axis direction. The fifth to eighth conductive materials 6325 to 6328 may be separated from the first to fourth conductive materials 6321 to 6324 in the y-axis direction.

A plurality of lower pillars DP passing through the first to fourth conductive materials 6321 to 6324 may be provided. Each lower pillar DP may extend in the z-axis direction. Also, a plurality of upper pillars UP passing through the fifth to eighth conductive materials 6325 to 6328 may be provided. Each upper pillar UP may extend in the z-axis direction.

Each of the lower pillars DP and the upper pillars UP may include an internal material 6361, an intermediate layer 6362, and a surface layer 6363. The intermediate layer 6362 may serve as a channel of the cell transistor. The surface layer 6363 may include a blocking dielectric layer, a charge storing layer and a tunneling dielectric layer.

The lower and the upper pillars DP and UP may be electrically coupled with each other through a pipe gate PG. The pipe gate PG may be disposed in the substrate 6311. For example, the pipe gate PG may include the same material as the lower pillar DP and the upper pillar UP.

A doping material 6312 of a second type extending in the x-axis direction and the y-axis direction may be provided over the lower pillars DP. For example, the doping material 6312 of the second type may include an n-type silicon material. The doping material 6312 of the second type may serve as a common source line CSL.

Drains 6340 may be provided over the upper pillars UP. The drains 6340 may include an n-type silicon material. First and second upper conductive materials 6351 and 6352 extending in the y-axis direction may be provided over the drains 6340.

The first and second upper conductive materials 6351 and 6352 may be spaced apart along the x-axis direction. The first and second upper conductive materials 6351 and 6352 may be formed of a metal. The first and second upper conductive materials 6351 and 6352 and the drains 6340 may be electrically coupled with each other through contact plugs. The first and second upper conductive materials 6351 and 6352 may serve as first and second bit lines BL1 and BL2, respectively.

The first conductive material 6321 may serve as a source select line SSL. The second conductive material 6322 may serve as a first dummy word line DWL1. The third and fourth conductive materials 6323 and 6324 may serve as first and second main word lines MWL1 and MWL2, respectively. The fifth and sixth conductive materials 6325 and 6326 may serve as third and fourth main word lines MWL3 and MWL4, respectively. The seventh conductive material 6327 may serve as a second dummy word line DWL2. The eighth conductive material 6328 may serve as a drain select line DSL.

The lower pillar DP and the first to fourth conductive materials 6321 to 6324 adjacent to the lower pillar DP may form a lower string. The upper pillar UP and the fifth to eighth conductive materials 6325 to 6328 adjacent to the upper pillar UP may form an upper string. The lower and the upper string may be electrically coupled with each other through the pipe gate PG. One end of the lower string may be electrically coupled to the doping material 6312 of the second type which serves as the common source line CSL. One end of the upper string may be electrically coupled to a corresponding bit line through the drain 6340. One lower string and one upper string may form one cell string which is electrically coupled between the doping material 6312 serving as the common source line CSL and a corresponding one of the upper conductive material layers 6351 and 6352 serving as the bit line BL.

For example, the lower string may include a source select transistor SST, the first dummy memory cell DMC1, and the first and second main memory cells MMC1 and MMC2. The upper string may include the third and fourth main memory cells MMC3 and MMC4, the second dummy memory cell DMC2 and a drain select transistor DST.

In FIGS. 9 and 10, the upper string and the lower string may form a NAND string NS. The NAND string NS may include a plurality of transistor structures TS. Since the transistor structure included in the NAND string NS in FIGS. 9 and 10 is described above in detail with reference to FIG. 7, a detailed description thereof will be omitted herein.

Figure 11:
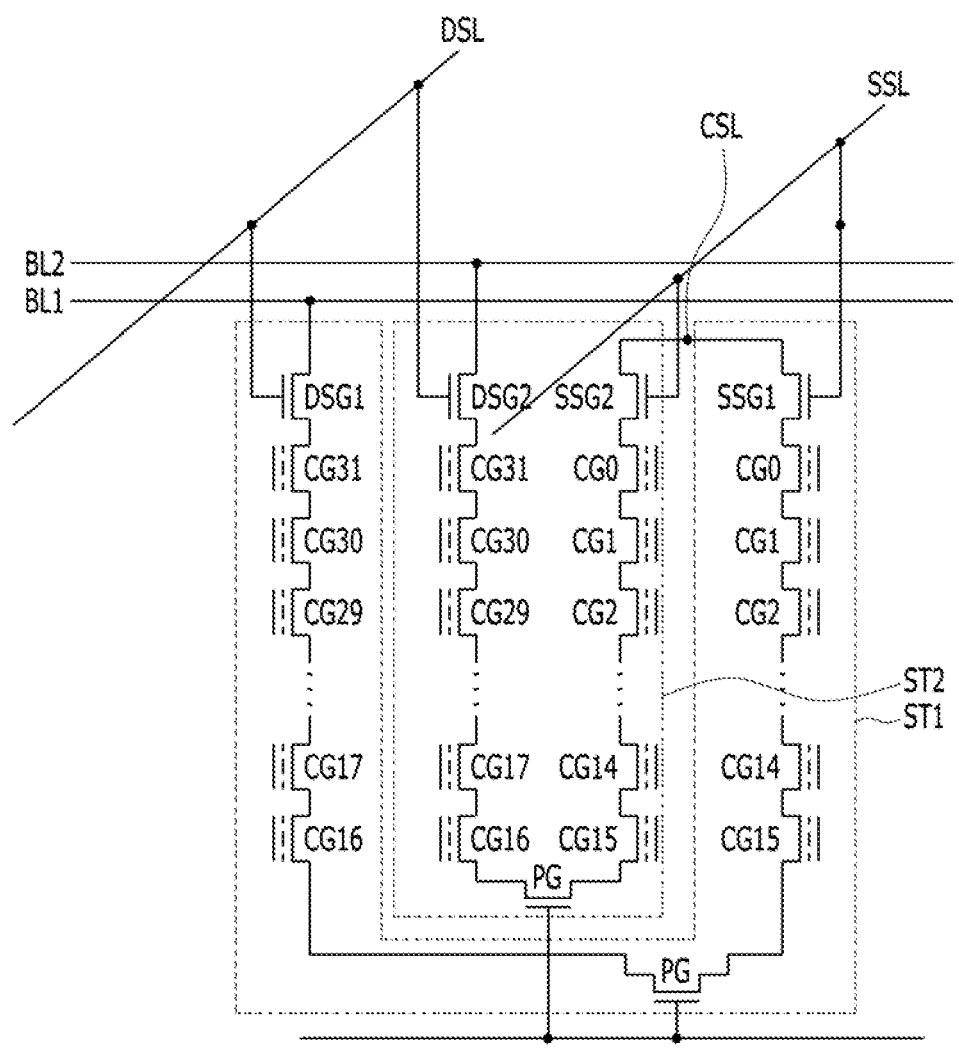

FIG. 11 is a circuit diagram illustrating the equivalent circuit of the memory block BLKj having the second structure as described above with reference to FIGS. 9 and 10. For the sake of convenience, only a first string ST1 and a second string ST2 are shown, forming a pair in the memory block BLKj in the second structure.

Referring to FIG. 11, in the memory block BLKj having the second structure among the plurality of blocks of the memory device 150, a plurality of cell strings, each of which is implemented with one upper string and one lower string electrically coupled through the pipe gate PG as described above with reference to FIGS. 9 and 10, may be provided in such a way as to define a plurality of pairs.

Namely, in memory block BLKj having the second structure, memory cells CG0 to CG31 stacked along a first channel CH1 (not shown), for example, at least one source select gate SSG1 and at least one drain select gate DSG1 may form a first string ST1, and memory cells CG0 to CG31 stacked along a second channel CH2 (not shown), for example, at least one source select gate SSG2 and at least one drain select gate DSG2 may form a second string ST2.

The first and second strings ST1, ST2 may be electrically coupled to the same drain select line DSL and the same source select line SSL. The first string ST1 may be electrically coupled to a first bit line BL1. The second string ST2 may be electrically coupled to a second bit line BL2.

Although FIG. 11 shows that the first string ST1 and the second string ST2 are electrically coupled to the same drain select line DSL and the same source select line SSL, it may be envisaged that the first string ST1 and the second string ST2 may be electrically coupled to the same source select line SSL and the same bit line BL, the first string ST1 may be electrically coupled to a first drain select line DSL1 and the second string ST2 may be electrically coupled to a second drain select line DSL2. Further it may be envisaged that the first string ST1 and the second string ST2 may be electrically coupled to the same drain select line DSL and the same bit line BL, the first string ST1 may be electrically coupled to a first source select line SSL1 and the second string ST2 may be electrically coupled a second source select line SSL2.

Hereinafter, a data processing operation for a memory device in a memory system will be described with reference to FIGS. 12 to 14, according to an embodiment of the present invention. In particular, a data processing operation when data is programmed into a memory device is described in more detail below, as an example.

For example, in the memory system of FIG. 1, a data processing operation may include for example, command data corresponding to a command received from the host 102. The command data may be, for example, write data corresponding to a write command received from the host 102. The command data may be stored in a buffers/cache included in the memory 144 of the controller 130. The data processing operation may further include writing the data stored in the buffer/cache in a plurality of memory blocks included in the memory device 150. Stated otherwise, the data stored in the buffer/cache may be programmed into the plurality of memory blocks of the memory device. The data programmed into the memory device 150 may be updated and re-programmed into the memory device 150 a plurality of times as may be needed.

Figure 12:
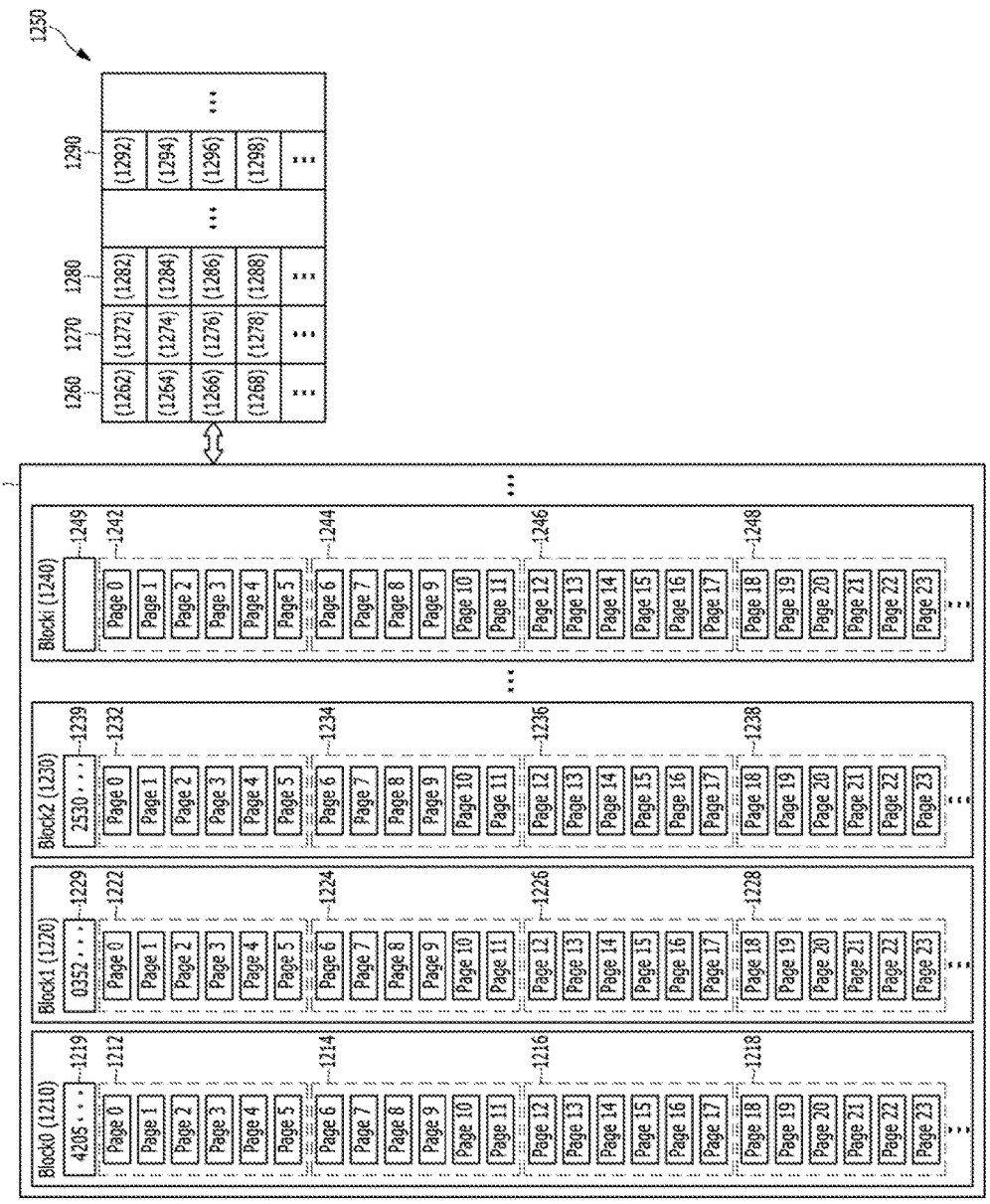
FIGS. 12 to 14 are diagrams illustrating a data processing operation, according to an embodiment of the present invention.

In the embodiment of FIG. 12, write data corresponding to a write command received from the host 102 may be programmed and stored in the plurality of memory blocks 152, 154 and 156 of the memory device 150 as described above. In particular, each of the memory blocks may include a plurality of pages, and the write data may be programmed and stored in pages of a memory block corresponding to the write commend. When a write command is received from the host 102 with respect to write data programmed into pages of a memory block, the write data may be updated and programmed into different pages of the same or different memory block. Accordingly, the write data stored in the previous pages of the memory blocks may become invalid data and the previous pages of the memory blocks may become invalid pages. If invalid pages are included in memory blocks of the memory device 150 as described above, an operation for processing data, for example, a garbage collection (GC), may be performed between the memory blocks of the memory device 150 in order to maximize a use efficiency of the memory device 150. An example in which the garbage collection for a data program into the memory blocks of the memory device 150 is performed will be described in more detail below.

It is noted that the controller 130 may perform a data processing operation as will be described below. For example, the processor 134 of the controller 130 may perform the data processing through the FTL, as described above. For example, the processor 134 may search the memory blocks of the memory device 150 for valid pages through the FTL and generate an empty memory block, an open memory block, or a free memory block by performing the garbage collection.

In an embodiment of the present invention, the controller 130 may store the write data corresponding to the write command received from the host 102 in the buffer included in the memory 144 and then may program the data stored in the buffer, into one page of a specific one of the plurality of memory blocks included in the memory device 150. For example, the controller 130 may write the data stored in the buffer into a first page of a first memory block by performing a program operation. Furthermore, when the controller 130 may receive a write command for the first page of the first memory block from the host 102, the controller 130 may perform a program operation on the data stored in the first page of the first memory block. For the data program operation, the controller 130 may store the data of the first page in a different page of the same memory block or in a page of a different memory block. For example, the data of the first page may be stored in a second page of the first memory block or in a first page of a second memory block. In this case, the controller 130 may treat data stored in the previous page of the memory block, for example, the data stored in the first page of the first memory block as invalid data. Also, the first page of the first memory block may become an invalid page.

Furthermore, in an embodiment of the present invention, a data processing operation may include a garbage collection performed on the memory blocks of the memory device 150 as is described as an example below. For example, in a data processing operation, the controller 130 may copy data and store the copied data between the memory blocks of the memory device 150. The controller 130 may copy the data of valid pages (i.e., valid data) included in the memory blocks and store the copied data in memory blocks on which a data program has not been performed, such as an empty memory block, an open memory block, or a free memory block. The copying and storing operations may be performed by taking into consideration invalid pages in the memory blocks on which the data programs have been completed, in other words, the memory blocks in which data write operations have been completed for all the pages included in each of the memory blocks (i.e., closed memory blocks on which the data programs have been performed).

In an embodiment, an update program may be performed on the data stored in the memory blocks of the memory device 150, i.e., a data processing operation in which a write command for data stored in the memory blocks may be received from the host 102 and write data corresponding to the write command may be programmed into the memory blocks of the memory device 150.

An example, of a garbage collection will be described in more detail below. In a garbage collection, a memory block for data processing, for example, a source memory block may be identified from closed memory blocks in the memory device 150. Then, data stored in the source memory block may be copied and stored in a target memory block, such as an empty memory block, open memory block, or free memory block in which data programs have not been performed on all the pages included in the memory block (also referred to often as an open or free memory block). An erase operation may be performed on the source memory, thereby generating the source memory as the empty, open or free memory block.

Referring now to FIG. 12, the controller 130 may store write data corresponding to a write command received from the host 102, in a buffer included in the memory 144 of the controller 130 and may program the stored write data into a plurality of memory blocks included in a memory device 1200, for example, a block0 1210, a block1 1220, a block2 1230, and a blocki 1240.

Each of the plurality of memory blocks included in the memory device 150 may include a plurality of pages as described above. Each of the memory blocks may include a plurality of sub-memory blocks including a preset number of pages. For example, each of the memory blocks may be divided into a plurality of sub-memory blocks including a preset number of pages. In an embodiment of the present invention, when an update program may be performed on data stored in the memory blocks of the memory device 150, valid pages in the sub-memory blocks of the memory blocks corresponding to the update program may be identified. Then, valid page count ("VPC") information indicative of the number of valid pages in the sub-memory blocks of the memory blocks may be included in a map list. For example, the controller 130 may generate the VPC information together with map information about the memory block, store the VPC information and the map information in a memory block, and perform the data processing between the memory blocks of the memory device 150 based on the VPC information. For example, the controller 130 may check the map information and perform the garbage collection based on the VPC information.

For example, in an embodiment of the present invention, the VPC information about each of the plurality of sub-memory blocks included in each of the memory blocks may be included in a map list in a bitmap form. Memory blocks whose map information needs to be searched for and checked may be identified based on the VPC information included in the map list in order to perform the data processing on the memory blocks of the memory device 150. Furthermore, a memory block on which the data processing needs to be performed, for example, a source memory block may be searched for in the memory blocks based on the VPC information. Data stored in a valid page of the source memory block (i.e., valid data) may be copied and stored in a target memory block. In this case, the controller 130 may store the map list in the memory 144 of the controller 130 or a specific one of the memory blocks of the memory device 150. Map information indicating that read/write data has been stored in the memory device 150, for example, the map information including storage information about read/write data, may be stored together with address information, page information, logical to physical (L2P) information, physical to logical (P2L) information, or meta data including such information in the specific memory block in which the map list has been stored.

For example, more specifically, each of the plurality of memory blocks included in the memory device 150, for example, each of the block0 1210, block1 1220, block2 1230, and blocki 1240 of a memory device 1200 may include a plurality of pages. Furthermore, each of the block0 1210, block1 1220, block2 1230, and blocki 1240 may include a plurality of sub-memory blocks in which a preset number of pages, for example, six (6) pages may be grouped. For example, each of the block0 1210, block1 1220, block2 1230, and blocki 1240 of the memory device 1200 may be divided into a plurality of sub-memory blocks each including six pages. For example, the block0 1210 of the memory device 1200 may include a sub-memory block0 1212, a sub-memory block1 1214, a sub-memory block2 1216, and a sub-memory blocki 1218, each of which may include six pages. The block1 1220 of the memory device 1200 may include a sub-memory block0 1222, a sub-memory block1 1224, a sub-memory block2 1226, and a sub-memory block3 1228, each of which may include six pages. The block2 1230 of the memory device 1200 may include a sub-memory block0 1232, a sub-memory block1 1234, a sub-memory block2 1236, and a sub-memory block3 1238, each of which may include six pages. The blocki 1240 of the memory device 1200 may include a sub-memory block0 1242, a sub-memory block1 1244, a sub-memory block2 1246, and a sub-memory block3 1248, each of which may include six pages. That is, the block0 1210, block1 1220, block2 1230, and blocki 1240 of the memory device 1200 may be divided into the respective sub-memory block0 1212, 1222, 1232, and 1242 each including six pages, the respective sub-memory block1 1214, 1224, 1234, and 1244 each including six pages, the respective sub-memory block2 1216, 1226, 1236, and 1246 each including six pages, and the respective sub-memory block3 1218, 1228, 1238, and 1248 each including six pages.

The number of pages included in each of sub-memory blocks included in each of the block0 1210, block1 1220, block2 1230, and blocki 1240 of the memory device 1200 may be determined by taking into consideration the size of the memory 144 of the controller 130. For example, the number of pages grouped in each of the sub-memory blocks included in each of the block0 1210, block1 1220, block2 1230, and blocki 1240 of the memory device 1200 may be determined by taking into consideration a size necessary for the memory 144 of the controller 130 to generate and store the VPC information. For example, if the required size of the memory 144 of the controller 130 is minimum, a single page may form each sub-memory block, and a bitmap indicating whether each page is a valid page may become VPC information about the blocks block0 1210, block1 1220, block2 1230, and blocki 1240 of the memory device 1200. In this case, when a single page forms each sub-memory block and a corresponding page is a valid page, a value of "1" may be set in a bitmap indicating whether each page is a valid page. When a single page forms each sub-memory block and a corresponding page is an invalid page, a value of "0" may be set in the bitmap indicating whether each page is a valid page. Accordingly, the VPC information about the blocks block0 1210, block1 1220, block2 1230, and blocki 1240 of the memory device 1200 may be included in a bitmap form.

Furthermore, when the controller 130 performs an update program on data stored in the plurality of memory blocks included in the memory device 150, for example, the block0 1210, block1 1220, block2 1230, and blocki 1240 of the memory device 1200 as described above, information about valid pages included in the plurality of memory blocks that is, the VPC information about the plurality of memory blocks may be stored in a specific region of each of the plurality of memory blocks block0 1210, the block1 1220, the block2 1230, and the blocki 1240 and also included in a map list 1250 in a bitmap form.

For example, the controller 130 may store the VPC information about the latest update program for each of the plurality of memory blocks block0 1210, block1 1220, block2 1230, and blocki 1240 of the memory device 1200 (i.e., VPC information about the current state of the plurality of memory blocks block0 1210, the block1 1220, the block2 1230, and the blocki 1240) in a specific region of each of the plurality of memory blocks block0 1210, the block1 1220, the block2 1230, and the blocki 1240. For example, the VPC information on the latest update program may be stored in the region 1219 of the block0 1210, the region 1229 of the block1 1220, the region 1239 of the block2 1230, and the region 1249 of the blocki 1240. Furthermore, the controller 130 may include the VPC information, stored in the specific region of each of the plurality of memory blocks block0 1210, the block1 1220, the block2 1230, and the blocki 1240, in the map list 1250 in a bitmap form. The controller 130 may store in the memory 144 of the controller 130 the map list 1250 having the VPC information about the current state of each of the plurality of memory blocks block0 1210, the block1 1220, the block2 1230, and the blocki 1240.

For example, the VPC information about the block0 1210 may be stored in the region 1219 of the block0 1210. The VPC information about the block1 1220 may be stored in the region 1229 of the block1 1220. The VPC information about the block2 1230 may be stored in the region 1239 of the block2 1230. The VPC information about the blocki 1240 may be stored in the region 1249 of the blocki 1240.

Furthermore, the VPC information about the plurality of memory blocks block0 1210, block1 1220, block2 1230, and blocki 1240 of the memory device 1200 may be stored in corresponding columns of the map list 1250. For example, the VPC information about the block0 1210 may be stored in a first column 1260, the VPC information about the block1 1220 may be stored in a second column 1270, the VPC information about the block2 1230 may be stored in a third column 1280, and the VPC information about the blocki 1240 may be stored in an i–1th column 1290.

Furthermore, since the VPC information about the blocks 1210, 1220, 1230, and 1240 may be included in the map list 1250 in a bitmap form, the VPC information about the sub-memory blocks of the blocks 1210, 1220, 1230, and 1240 may be stored in specific bit regions of the respective columns 1260, 1270, 1280, and 1290 of the map list 1250. For example, the columns 1260, 1270, 1280, and 1290 of the map list 1250 may correspond to the respective blocks 1210, 1220, 1230, and 1240 of the memory device 1200, and the specific bit regions of the columns 1260, 1270, 1280, and 1290 of the map list 1250 may correspond to the respective sub-memory blocks of the blocks 1210, 1220, 1230 and 1240. Accordingly, the VPC information about the sub-memory blocks of each of the blocks 1210, 1220, 230, and 1240 may be stored in corresponding specific bit regions of the map list 1250 in a bitmap form.

For example, the VPC information about the sub-memory block0 1212 of the block0 1210 may be stored in a first bit region 1262 of the first column 1260 of the map list 1250. The VPC information about the sub-memory block1 1214 of the block0 1210 may be stored in a second bit region 1264 of the first column 1260 of the map list 1250. The VPC information about the sub-memory block2 1216 of the block0 1210 may be stored in a third bit region 1266 of the first column 1260 of the map list 1250. The VPC information about the sub-memory block3 1218 of the block0 1210 may be stored in a fourth bit region 1268 of the first column 1260 of the map list 1250.

Furthermore, the VPC information about the sub-memory block0 1222 of the block1 1220 may be stored in a first bit region 1272 of the second column 1270 of the map list 1250. The VPC information about the sub-memory block1 1224 of the block1 1220 may be stored in a second bit region 1274 of the second column 1270 of the map list 1250. The VPC information about the sub-memory block2 1226 of the block1 1220 may be stored in a third bit region 1276 of the second column 1270 of the map list 1250. The VPC information about the sub-memory block3 1228 of the block1 1220 may be stored in a fourth bit region 1278 of the second column 1270 of the map list 1250.

Furthermore, the VPC information about the sub-memory block0 1232 of the block2 1230 may be stored in a first bit region 1282 of the third column 1280 of the map list 1250. The VPC information about the sub-memory block1 1234 of the block2 1230 may be stored in a second bit region 1284 of the third column 1280 of the map list 1250. The VPC information about the sub-memory block2 1236 of the block2 1230 may be stored in a third bit region 1286 of the third column 1280 of the map list 1250. The VPC information about the sub-memory block3 1238 of the block2 1230 may be stored in a fourth bit region 1288 of the third column 1280 of the map list 1250.

Furthermore, the VPC information about the sub-memory block0 1242 of the blocki 1240 may be stored in a first bit region 1292 of the $i-1^{th}$ column 1290 of the map list 1250. The VPC information about the sub-memory block1 1244 of the blocki 1240 may be stored in the second bit region 1294 of the $i-1^{th}$ column 1290 of the map list 1250. The VPC information about the sub-memory block2 1246 of the blocki 1240 may be stored in the third bit region 1296 of the $i-1^{th}$ column 1290 of the map list 1250. VPC information about the sub-memory block3 1248 of the blocki 1240 may be stored in the fourth bit region 1298 of the $i-1^{th}$ column 1290 of the map list 1250.

Bits indicative of the number of valid pages included in each of the sub-memory blocks of each of the blocks 1210, 1220, 1230, and 1240 may be allocated to specific bit regions storing the VPC information about each of the sub-memory blocks. For example, 1 bit may be allocated to each of the pages included in each of the sub-memory blocks. Accordingly, since each of the sub-memory blocks may include six pages, 6 bits may be allocated for each sub-memory block. Furthermore, if the update program is performed on data stored in the pages of sub-memory blocks in each of the blocks 1210, 1220, 1230, and 1240, in other words, when a write command for data stored in the pages of sub-memory blocks is received from the host 102 and a program is performed on the data, the VPC information stored in specific bit regions corresponding to the sub-memory blocks may be updated.

Assuming that the blocks block0 1210, block1 1220, and block2 1230 of the memory device 1200 may be closed memory blocks and the blocki 1240 of the memory device 1200 may be a target memory block, a data processing operation according to an embodiment of the present invention will be described in more detail below.

Figure 13:
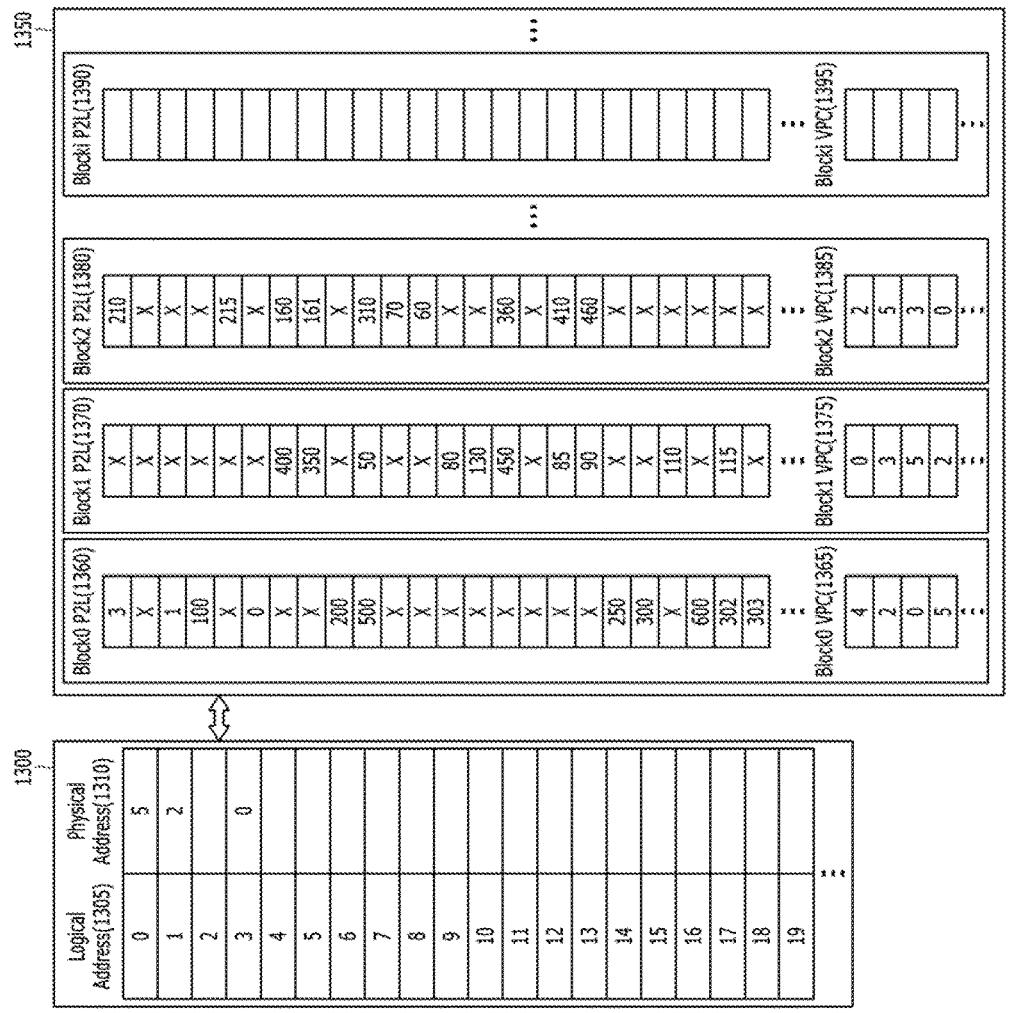

Referring to FIGS. 12 and 13, since the blocks block0 1210, block1 1220, and block2 1230 of the memory device 1200 may be closed memory blocks, write data corresponding to a write command received from the host 102 may be stored in the pages of the block0 1210, block1 1220, and block2 1230 of the memory device 1200. Information indicating that the write data is stored in the pages of the block0 1210, block1 1220, and block2 1230 of the memory device 1200, for example, L2P information 1300 and P2L information 1350 may be stored in the memory 144 of the controller 130 or a specific memory block of the memory device 1200. For example, the controller 130 may program and store the write data corresponding to the write command received from the host 102, in the pages of the block0 1210, block1 1220, and block2 1230 of the memory device 1200. Furthermore, the controller 130 may generate map information according to the storage of data in the pages of the blocks block0 1210, block1 1220, and block2 1230. For example, the controller 130 may generate the L2P information 1300 including logical address (1305)/physical address (1310) information of data having a logical page number and the P2L information 1350 including logical page number information of data stored in the pages of each of the blocks block0 1210, block1 1220, and block2 1230, and may store the L2P information 1300 and the P2L information 1350 generated as described above. Furthermore, the stored L2P information 1300 and P2L information 1350 may be updated in accordance with the program of the write data.

For example, the L2P information 1300 may include physical map information about data stored in the pages of all the memory blocks, such as the blocks block0 1210, block1 1220, and block2 1230 of the memory device 1200. Furthermore, the P2L information 1350 may include logical information about data stored in the pages of all the memory blocks of the memory device 1200, such as a block0 P2L table 1360 including the logical page number of data stored in the pages of the block0 1210, a block1 P2L table 1370 including the logical page number of data stored in the pages of the block1 1220, and a block2 P2L table 1380 including the logical page number of data stored in the pages of the block2 1230.

As described above, when the controller 130 may receive a write command for data stored in the pages of the blocks block0 1210, block1 1220, and block2 1230 (i.e., closed memory blocks), it may update and program write data corresponding to the write command, into pages of a new specific memory block other than the blocks block0 1210, block1 1220, and block2 1230. Accordingly, the controller 130 may update the aforementioned L2P information 1300 and P2L information 1350 according to the update program of the write data for the pages of such new specific memory block.

Furthermore, the controller 130 may update the map list 1250 including the VPC information, in response to the update program of the write data and store the updated map list 1250 in the blocks block0 1210, block1 1220, and block2 1230 (i.e., closed memory blocks) along with the P2L information 1350. For example, the controller 130 may update a map list including the VPC information about the sub-memory blocks of each of the blocks block0 1210, block1 1220, and block2 1230. For example, the controller 130 may update a block0 VPC list 1365 including the VPC information about the sub-memory blocks of the block0 1210, along with the block0 P2L table 1360, in response to the update program of the write data to store the updated map list and block0 P2L table 1360. Furthermore, the controller 130 may update a block1 VPC list 1375 including VPC information about the sub-memory blocks of the block1 1220, along with the block1 P2L table 1370, in response to the update program of the write data to store the updated block1 VPC list 1375 and block1 P2L table 1370. Furthermore, the controller 130 may update a block2 VPC list 1385 including VPC information about the sub-memory blocks of the block2 1230, along with the block2 P2L table 1380, in response to the update program of the write data to store the updated block2 VPC list 1385 and block2 P2L table 1380. In this case, if the blocki 1240 of the memory device 1200 is a close memory block, the controller 130 may update a blocki VPC list 1395 including VPC information about the sub-memory blocks of the blocki 1240, along with the blocki P2L table 1390, in response to the update program of the write data to store the updated blocki VPC list 1395 and blocki P2L table 1390.

For example, more specifically, when a write command is received from the host 102 for data stored in the remaining pages other than the pages page0, page2, page3, page5, page8, page9, page18, page19, page21, page22, and page23 of the block0 1210 which is a close memory block, the controller 130 may program write data corresponding to the write command into a specific memory block of the memory device 150. Accordingly, the pages page0, page2, page3, page5, page8, page9, page18, page19, page21, page22, and page23 of the block0 1210 may become valid pages, whereas the remaining pages of the block0 1210 may become invalid pages. In this case, the controller 130 may count the valid pages included in the sub-memory blocks, block0 1212, block1 1214, block2 1216, and block3 1218 of the block0 1210 which is a close memory block, and may store the VPC information, for example, "4205", about the sub-memory blocks block0 1212, block1 1214, block2 1216, and block3 1218 of the block0 1210, in the region1 1219 of the block0 1210 and the first column 1260 of the map list 1250 as described above. Furthermore, the controller 130 may store the VPC information 4205 along with P2L information about the block0 1210, for example, the block0 P2L table 1360, in the block0 VPC list 1364.

Furthermore, when a write command for data stored in the remaining pages other than the page6, page7, page9, page12, page13, page14, page16, page17, pag20, and page22 of block1 1220 which is a close memory block, may be received from the host 102, the controller 130 may program write data corresponding to the write command into a specific memory block of the memory device 150. Accordingly, the page6, page7, page9, page12, page13, page14, page16, page17, pag20, and page22 of the block1 1220 may become valid pages, and the remaining pages of the block1 1220 may become invalid pages. In this case, the controller 130 may count the valid pages included in the sub-memory blocks, block0 1222, block1 1224, block2 1226, and block3 1228 of the block1 1220 which is a close memory block, and may store the VPC information, for example, "0352", about the sub-memory blocks, block0 1222, block1 1224, block2 1226, and block3 1228 of the block1 1220, in the region1 1229 of the block1 1220 and the second column 1270 of the map list 1250 as described above. Furthermore, the controller 130 may store the VPC information "0352" along with P2L information about the block1 1220, for example, the block1 P2L table 1370 in the block1 VPC list 1375.

Furthermore, when a write command for data stored in the remaining pages other than the page0, page4, page6, page7, page9, page10, page11, page14, page16, and page17 of the block2 1230 which is a close memory block, may be received from the host 102, the controller 130 may program write data corresponding to the write command into a specific memory block of the memory device 150. Accordingly, the page0, page4, page6, page7, page9, page10, page11, page14, page16, and page17 of the block2 1230 may become valid pages, and the remaining pages of the block1 1220 may become invalid page. In this case, the controller 130 may count the valid pages included in the sub-memory blocks, block0 1232, block1 1234, block2 1236, and block3 1238 of the block2 1230 which is a close memory block, and may store the VPC information, for example, "2530", about the sub-memory blocks, block0 1232, block1 1234, block2 1236, and block3 1238 of the block2 in the region2 1239 of the block2 1230 and the third column 1280 of the map list 1250 as described above. Furthermore, the controller 130 may store the VPC information "2530" along with P2L information about the block2 1230, for example, the block2 P2L table 1380 in the block2 VPC list 1358.

Accordingly, if the garbage collection is performed, the controller 130 may not need to perform search and check operations on the L2P information 1300 for all pages. For example, the controller 130 may not need to perform the search and check operations on the L2P information 1300 of all of the blocks block0 1210, block1 1220, and block2 1230 (i.e., closed memory blocks) based on the P2L information 1350 of the blocks block0 1210, block1 1220, and block2 1230 for identifying the valid pages included in the closed memory blocks. For example, the controller 130 may compare current VPC information included in the map list 1250 having the current VPC information about the blocks block0 1210, block1 1220, and block2 1230 in a bitmap form, with previous VPC information stored along with the P2L information 1350 of the blocks block0 1210, block1 1220, and block2 1230, for example, the previous VPC information that has been stored along with the block P2L tables 1360, 1370, and 1380 and that is included in the block VPC lists 1365, 1375, and 1385. As a result of the comparison, if VPC information has been changed, the controller 130 may search and check the P2L information 1350 and the L2P information 1300 on only the sub-memory blocks of the blocks block0 1210, block1 1220, and block2 1230 whose VPC information has been changed. Furthermore, the controller 130 may not perform the search and check operations on the P2L information 1350 and the L2P information 1300 with respect to the sub-memory blocks of the blocks block0 1210, block1 1220, and block2 1230 whose VPC information has not been changed and may identify valid pages included in the blocks block0 1210, block1 1220, and block2 1230 (i.e., closed memory blocks) based on the VPC information included in the map list 1250 or the VPC information stored along with the P2L information 1350. Furthermore, the controller 130 may copy valid data, stored in the valid pages included in the blocks block0 1210, block1 1220, and block2 1230 (i.e., closed memory blocks), program the copied valid data into the pages included in the blocki 1240 (i.e., a target memory block), and generate the blocks block0 1210, block1 1220, and block2 1230 as an empty memory block, an open memory block, or a free memory block by performing an erase operation on the blocks block0 1210, block1 1220, and block2 1230 (i.e., closed memory blocks).

When an un-mapping command including a trim or a discard may be received from the host 102, the controller 130 may un-map a logical address corresponding to the un-mapping command, from the L2P information 1300 about the memory blocks of the memory device 150, for example, the blocks block0 1210, block1 1220, and block2 1230. Then, the controller 130 may not update the P2L information 1350 as well as the L2P information 1300, but may set to "0" the VPC information about each of the sub-memory blocks of the blocks block0 1210, block1 1220, and block2 1230. Accordingly, an un-map operation corresponding to the un-mapping command can be rapidly processed. For example, when the un-mapping command is received from the host 102, the controller 130 may not perform the update operation on the L2P information 1300 and the P2L information 1350 corresponding to the un-mapping command, in particular, the update operation on the L2P information 1300, but may set to "0" both the VPC information stored in the map list 1250 and the VPC information about the block VPC lists 1365, 1375, and 1385 stored along with the P2L information 1350. For example, when the un-mapping command is received from the host 102, the controller 130 may set to "0" the VPC information indicating that only invalid pages are presented in the sub-memory blocks of the blocks block0 1210, block1 1220, and block2 1230, thereby being capable of rapidly processing the un-map operation corresponding to the un-mapping command. The valid pages included in the sub-memory blocks of the block0 1210 (i.e., a closed memory block), for example, may be identified, as described in more detail below.

Figure 14:
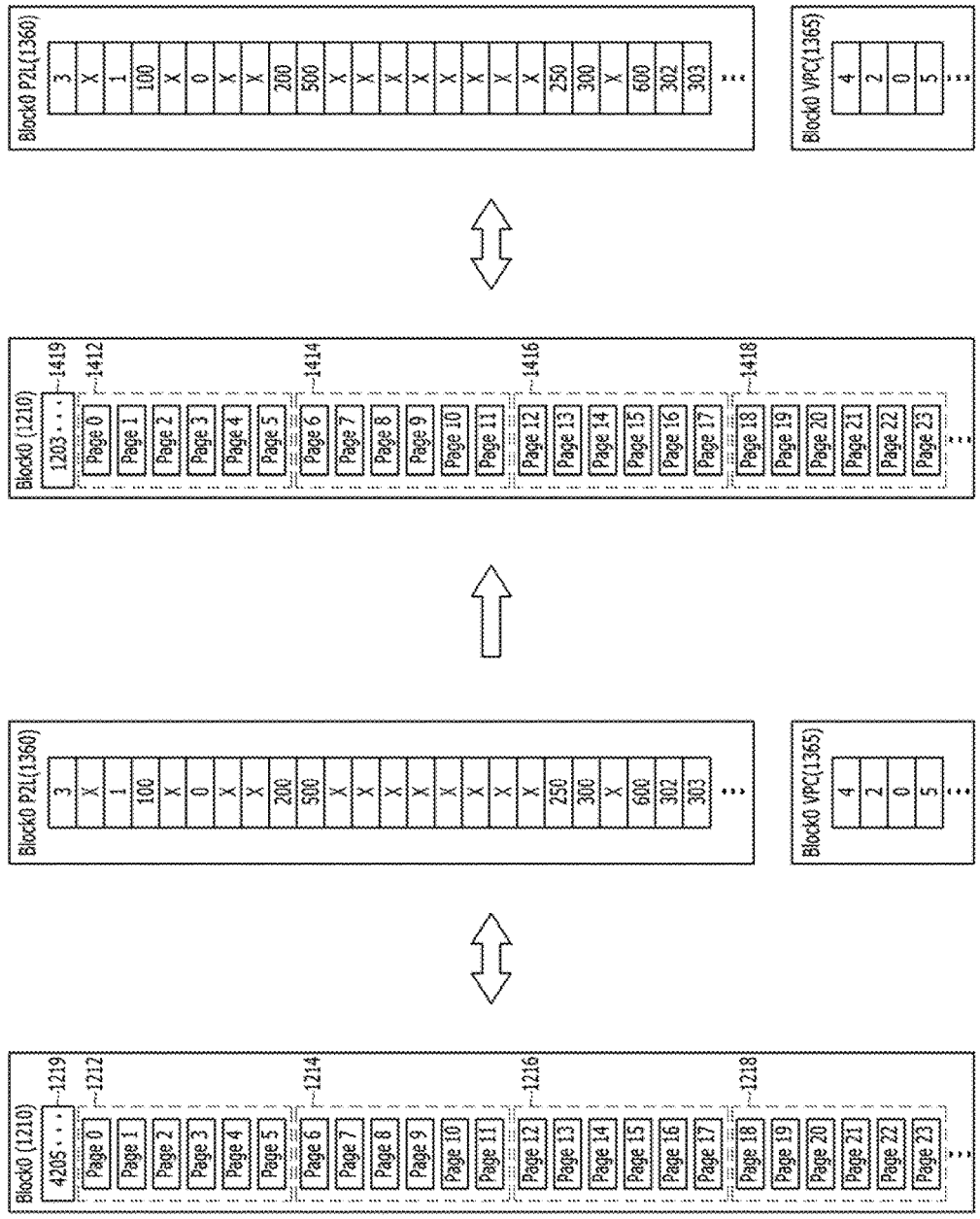

Referring to FIG. 14, the controller 130 may program write data corresponding to a write command received from the host 102, into the block0 1210 (i.e., a close memory block) as described above. For example, the controller 130 may receive a write command corresponding to data stored in the remaining pages other than the pages, page0, page2, page3, page5, page8, page9, page18, page19, page21, page22, and page23 of the block0 1210 (i.e., a closed memory block), from the host 102 and program write data corresponding to the write command into a specific memory block of the memory device 150. Accordingly, the page0, page2, page3, page5, page8, page9, page18, page19, page21 page22, and page23 of the block0 1210 may become valid pages, and the remaining pages of the block0 1210 may become invalid pages. The controller 130 may count the valid pages included in the sub-memory blocks block0 1212, block1 1214, block2 1216, and block3 1218 of the block0 1210 (i.e., a closed memory block). The controller 130 may store the VPC information, for example, "4205" about the sub-memory blocks block0 1212, block1 1214, block2 1216, and block3 1218 of the block0 1210, in the region1 1219 of the block0 1210 and the first column 1260 of the map list 1250, and also may store the VPC information in the block0 VPC list 1365 along with the P2L information of the block0 1210, for example, the block0 P2L table 1360.

Next, when a write command for data stored in the page2, page3, page5, page21, and page22 of the valid pages of the block0 1210 (i.e., a close memory block) is received from the host 102, the controller 130 may program write data corresponding to the write command, into a specific memory block of the memory device 150. Accordingly, the pages page2, page3, page5, page21, and page22 of the block0 1210 may become invalid pages in accordance with the update program for the block0 121 (i.e., a closed memory block). Accordingly, the controller 130 may count valid pages included in the sub-memory blocks, block0 1412, block1 1414, block2 1416, and block3 1418 of the block0 1210 (i.e., a closed memory block) and store the VPC information, for example "1203" (i.e., the VPC information of the current state) about the sub-memory blocks, block0 1412, block1 1414, block2 1416, and block3 1418 of the block0 1210, in the region1 1419 of the block0 1210 and the first column 1260 of the map list 1250.

When the valid pages included in the block0 1210 (i.e., a close memory block) are identified by the controller 130, that is, when the valid pages included in the sub-memory blocks 1412, 1214, 1416, and 1418 of the block0 1210 are identified by the controller 130 in the current state, the controller 130 may compare the VPC information stored in the region1 1419 of the block0 1210 and the map list 1250, with the VPC information included in the block0 VPC list 1365 and stored along with the block0 P2L table 1360 (i.e., the P2L information of the block0 1210). If the VPC information about the sub-memory blocks, block0 1412 and block3 1418 of the block0 1210, corresponding to the first and fourth bit regions 1262 and 1268, respectively, of the first column 1260 included in the map list 1250, has been changed, as a result of the comparison, the controller 130 may identify valid pages included in the sub-memory blocks, block0 1412 and block3 1418 of the block0 1210 by performing search and check operations on the L2P information 1300 about the P2L information 1350 in the sub-memory blocks, block0 1412 and block3 1418 of the block0 1210. Furthermore, the controller 130 may perform an update operation on the P2L information 1350 about the sub-memory blocks, block0 1412 and block 1418 and the L2P information 1300 and may perform an update operation on the block0 P2L table 1360. Furthermore, if there is no change in the VPC information about the sub-memory blocks, block1 1414 and block 1416 of the block0 1210 as a result of the comparison, the controller 130 may identify the valid page, included in the sub-memory blocks, block1 1414 and block2 1416, based on the VPC information included in the map list 1250 or the VPC information stored in the block0 VPC list 1365.

In this case, the controller 130 may compare the VPC information stored in the region1 1419 of the block0 1210 and the map list 1250, with the VPC information included in the block0 VPC list 1365 and stored along with the block0 P2L table 1360 (i.e., the P2L information of the block0 1210). Then, the controller 130 may identify the valid pages included in the sub-memory blocks 1412, 1414, 1416, and 1418 of the block0 1419, and may search and check the P2L information 1350 and the L2P information 1300 with respect to only the sub-memory blocks 1412 and 1418 of the block0 1419 whose VPC information has been changed. Accordingly, the search and check operations on the P2L information 1350 and the L2P information 1300 can be minimized, and the update operation on the P2L information 1350 and the L2P information 1300 corresponding to the search and check operations on the P2L information 1350 and the L2P information 1300 can be minimized.

Furthermore, the controller 130 may copy valid data stored in the valid pages of the sub-memory blocks 1412, 1414, and 1416 of the block0 1210 (i.e., a close memory block), program the copied valid data into the pages of the block1 1240 (i.e., a target memory block), and generate the block0 1210 as an empty memory block, an open memory block, or a free memory block by performing an erase operation on the block0 1210 (i.e., a close memory block). An operation for processing, by the memory system, data according to an embodiment of the present invention is described in more detail below with reference to FIG. 15.

Figure 15:
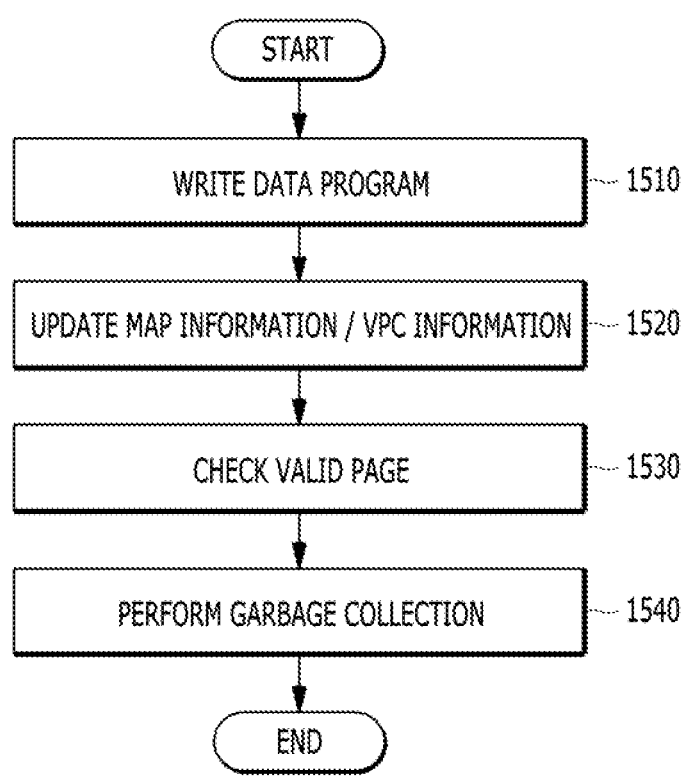
FIG. 15 is a flowchart of an operation for processing data, according to an embodiment of the present invention.

Referring to FIG. 15, when a write command may be received from the host at step 1510, the memory system may store write data corresponding to the write command, in the memory blocks of the memory device. In particular, when the write command for data stored in closed memory blocks of the memory device may be received from the host, the memory system may store data corresponding to the write command, in another specific one of the memory blocks of the memory device by performing a data program. In other words, the memory system may perform an update program.

Furthermore, at step 1520, the memory system may generate and update map information about the memory blocks of the memory device, for example, the L2P information and the P2L information in accordance with the data program for the memory blocks of the memory device and the data update program for the closed memory blocks. The memory system may generate and update VPC information about a plurality of sub-memory blocks included in each of the memory blocks of the memory device, in particular, the closed memory blocks. In this case, the VPC information may be stored in corresponding memory blocks of the memory device along with the P2L information.

Furthermore, at step 1530, the memory system may identify valid pages included in the sub-memory blocks included in each of the closed memory blocks by checking the VPC information about the sub-memory blocks. In this case, the search and check operations on the P2L information and the L2P information about the closed memory blocks can be minimized because the VPC information about the plurality of sub-memory blocks is checked.

Next, at step 1540, the memory system may perform a garbage collection on the closed memory blocks of the memory device. More specifically, the memory system may copy data stored in the valid pages included in the sub-memory blocks of the closed memory blocks. Then, the memory system may program the copied data into pages included in a target memory block, and generate each of the closed memory blocks as an empty memory block, an open memory block, or a free memory block by performing an erase operation on the closed memory blocks. The memory system may program the write data corresponding to the write command received from the host, into the pages of the empty memory block, open memory block, or free memory block as described above.

Data processing in the memory blocks of the memory device, including the operation for generating the empty memory block, open memory block, or free memory block by performing an update program in the memory blocks of the memory device, the operation for generating and updating a map list corresponding to the update program, the operation for identifying the valid pages included in the memory blocks, and the operation for performing the garbage collection for the memory blocks on the write data corresponding to the write command received from the host has been described in detail with reference to FIGS. 12 to 14. Accordingly, a detailed description of the operation is omitted.

The present invention provides a memory system and an operating method thereof that may reduce the complexity of data processing operations and the performance requirements of a memory device by maximizing the use efficiency of the memory device. As a result data may be processed to and from the memory device more rapidly and stably than with existing systems.

Although various embodiments have been described for illustrative purposes, it will be apparent to those skilled in the relevant art that various changes and modifications may be made without departing from the spirit and or scope of the invention as defined in the following claims.

What is claimed is:

1. A memory system, comprising:
a memory device comprising a plurality of memory blocks, each of the plurality of memory blocks comprising a plurality of pages having a plurality of memory cells coupled to a plurality of word lines, the memory device being suitable for inputting read data and outputting write data in the plurality of pages; and
a controller suitable for controlling the memory device in response to a request from a host,
wherein the controller is configured to arrange a plurality of sub-memory blocks, each including plural pages locating in at least one memory block; generate valid page count (VPC) information regarding each sub-memory block; program a first data corresponding to a first write command, received from the host, into at least one first sub-memory block among the plurality of sub-memory blocks; check VPC information in response to a second write command, which is received for updating the first data, to determine at least one valid sub-memory block among the plurality of sub-memory blocks; re-program the first data, programmed on the first sub-memory block, into the at least one valid sub-memory block determined based on the VPC information; update the VPC information regarding the at least one valid sub-memory block in the memory blocks; and store the VPC information in a map list.

2. The memory system of claim 1, wherein the map list comprises:
a plurality of columns, each column corresponding to a respective memory block, and a plurality of bit regions included in the columns of the memory blocks, each bit region corresponding to the respective sub-memory block of the memory blocks.

3. The memory system of claim 2, wherein the controller stores the VPC information about the first sub-memory block in a bit region corresponding to the first sub-memory block and included in a first column of the map list corresponding to the first sub-memory block in accordance with the re-program.

4. The memory system of claim 3, wherein the first sub-memory block is a closed memory block all pages of which have been subjected to a data program operation.

5. The memory system of claim 4, wherein the controller stores:
the map list in a memory of the controller;
the VPC information stored in bit regions of the map list corresponding to the closed memory block in the memory blocks; and
map information about the closed memory block in the memory blocks.

6. The memory system of claim 5, wherein the controller identifies valid pages included in the sub-memory blocks of the closed memory block by comparing the VPC information stored in the map list with VPC information stored in the closed memory block.

7. The memory system of claim 6, wherein if the VPC information is determined to be changed as a result of the comparison, the controller searches for and checks map information about a second sub-memory block which corresponds to a bit region storing the changed VPC information among the bit regions of the map list.

8. The memory system of claim 7, wherein the controller identifies the valid pages included in the second sub-memory block through the search and check of the map information and updates the map information about the second sub-memory block.

9. The memory system of claim 6, wherein if the VPC information is determined not to be changed as a result of the comparison, the controller identifies the valid pages included in the sub-memory blocks based on the VPC information.

10. The memory system of claim 6, wherein the controller generates an empty memory block, open memory block, or free memory block by performing garbage collection (GC) on the closed memory block whose valid page has been identified.

11. An operating method of a memory system, comprising:
arranging a plurality of sub-memory blocks of a memory device, the memory device comprising a plurality of memory blocks, each of the plurality of memory blocks comprising a plurality of pages having a plurality of memory cells coupled to a plurality of word lines, each sub-memory block including plural pages locating in at least one memory block;
generating valid page count (VPC) information regarding each sub-memory block;
receiving a first write command from a host;
programming a first data corresponding to the first write command into at least one first sub-memory block among the plurality of sub-memory blocks;
receiving a second write command for updating the first data, which is received from the host;
checking VPC information in response to the second write command to determine at least one valid sub-memory block among the plurality of sub-memory blocks;
re-programming the first data, programmed on the first sub-memory block, into the at least one valid sub-memory block determined based on the VPC information;
updating the VPC information regarding the at least one valid sub-memory block in the memory blocks; and
storing the VPC information in a map list.

12. The operating method of claim 11, wherein the map list comprises:
a plurality of columns each corresponding to the respective memory blocks, and
a plurality of bit regions included in the columns of the memory blocks each of which corresponds to the respective sub-memory blocks of the memory blocks.

13. The operating method of claim 12, wherein the storing of the map list comprises storing the VPC information about the first sub-memory block in a bit region corresponding to the first sub-memory block and included in a first column of the map list corresponding to the first sub-memory block in accordance with the re-programming.

14. The operating method of claim 13, wherein the first sub-memory block comprises a closed memory block comprising all pages on which a data program has been performed.

15. The operating method of claim 14, wherein the storing of the map list comprises:
storing the map list in a memory of the controller, and
storing in the memory blocks the VPC information stored in bit regions included in the columns of the map list and corresponding to the closed memory block and map information about the closed memory block.

16. The operating method of claim 15, further comprising identifying valid pages included in the sub-memory blocks of the closed memory block by comparing the VPC information stored in the map list with VPC information stored in the closed memory block.

17. The operating method of claim 16, wherein if the VPC information is determined to be changed as a result of the comparison, the identifying of the valid page comprises searching for and checking map information about a second sub-memory block which corresponds to a bit region storing the changed VPC information among the bit regions of the map list.

18. The operating method of claim 17, further comprising:
identifying the valid pages included in the second sub-memory block through the search and check of the map information, and
updating the map information about the second sub-memory block.

19. The operating method of claim 16, wherein if the VPC information is determined to be not changed as a result of the comparison, the identifying of the valid pages comprises identifying the valid pages included in the sub-memory blocks based on the VPC information.

20. The operating method of claim 16, further comprising generating an empty memory block, an open memory block, or a free memory block by performing garbage collection (GC) on the closed memory blocks whose valid page has been identified.

* * * * *